(12) United States Patent
Kataoka

(10) Patent No.: US 9,479,195 B2
(45) Date of Patent: Oct. 25, 2016

(54) NON-TRANSITORY COMPUTER-READABLE RECORDING MEDIUM, COMPRESSION METHOD, DECOMPRESSION METHOD, COMPRESSION DEVICE, AND DECOMPRESSION DEVICE

(71) Applicant: FUJITSU LIMITED, Kawasaki-shi, Kanagawa (JP)

(72) Inventor: Masahiro Kataoka, Kamakura (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/009,169

(22) Filed: Jan. 28, 2016

(65) Prior Publication Data

US 2016/0226516 A1 Aug. 4, 2016

(30) Foreign Application Priority Data

Jan. 30, 2015 (JP) .................................. 2015-017617

(51) Int. Cl.
*H03M 7/40* (2006.01)

(52) U.S. Cl.
CPC .................................... *H03M 7/405* (2013.01)

(58) Field of Classification Search
CPC . G06F 17/30; G06F 17/30153; H03M 7/405
USPC ..................... 341/50, 51, 63, 65, 52; 711/65
See application file for complete search history.

(56) References Cited

U.S. PATENT DOCUMENTS

| 5,870,036 | A | 2/1999 | Franaszek et al. |
| 6,985,965 | B2 | 1/2006 | Hannu et al. |
| 2001/0026231 | A1* | 10/2001 | Satoh ................... H03M 7/3086 341/87 |
| 2013/0082850 | A1* | 4/2013 | Takeshima .......... H03M 7/3068 341/65 |
| 2013/0262808 | A1* | 10/2013 | Unno .................... H03M 7/702 711/165 |
| 2014/0214779 | A1* | 7/2014 | Francis ............. G06F 17/30153 707/693 |
| 2015/0326248 | A1* | 11/2015 | Wu ..................... H03M 7/3086 341/64 |

FOREIGN PATENT DOCUMENTS

| JP | 8-288861 | 11/1996 |
| JP | 2004-514366 | 5/2004 |

\* cited by examiner

*Primary Examiner* — Peguy Jean Pierre
(74) *Attorney, Agent, or Firm* — Oblon, McClelland, Maier & Neustadt, L.L.P.

(57) ABSTRACT

At a preliminary stage, a compressing unit generates frequency information, outputs a compression code associated with a piece of first data of the longest matching character string among the pieces of first data contained in the frequency information, when the longest matching character string has a length smaller than the predetermined length and outputs a compression code associated with a piece of position information matching with position information about the longest matching character string among the pieces of position information about the second data contained in the frequency information and a compression code associated with length information about the longest matching character string among the pieces of first data contained in the frequency information, when the longest matching character string has a length equal to or larger than the predetermined length.

18 Claims, 35 Drawing Sheets

FIG.1
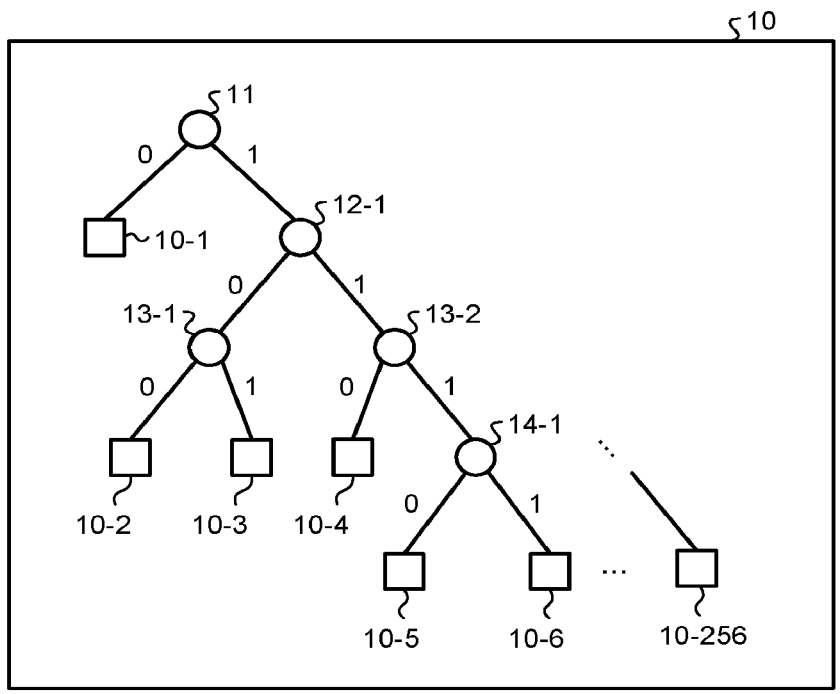
DATA STRUCTURE OF NODE
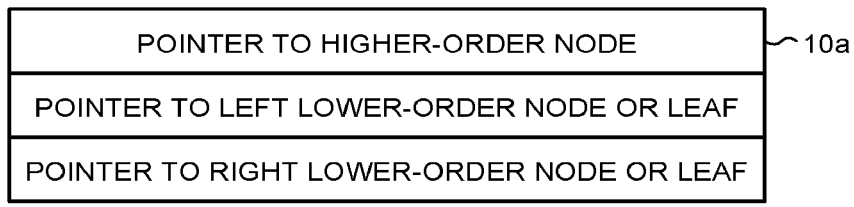
DATA STRUCTURE OF LEAF

FIG.6

| CHARACTER CODE/LENGTH | APPEARANCE FREQUENCY |
|---|---|
| 00000000 | a1 |
| 00000001 | a2 |
| 00000010 | a3 |
| ... | ... |
| 11111111 | a256 |

20

FIG.9
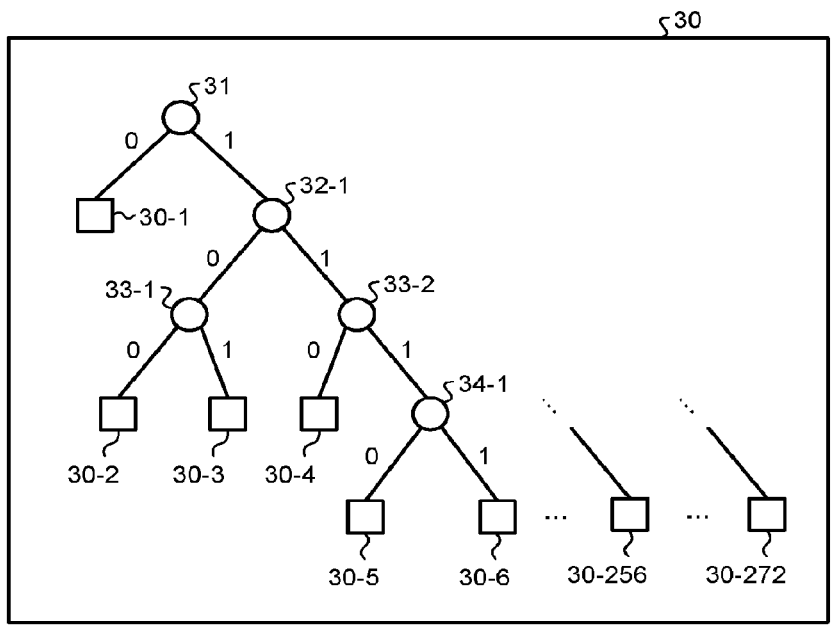
DATA STRUCTURE OF NODE
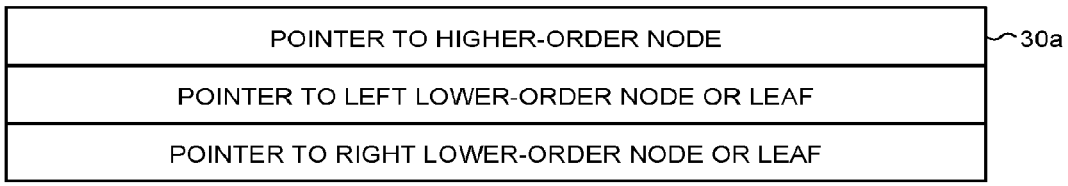
DATA STRUCTURE OF LEAF
IDENTIFICATION INFORMATION "0": CHARACTER CODE OR LENGTH OF LONGEST MATCHING CHARACTER STRING
IDENTIFICATION INFORMATION "1": NUMBER OF CONSECUTIVE "0"S

FIG.14

| CHARACTER CODE/ LENGTH | APPEARANCE FREQUENCY |
|---|---|
| 00000000 | a1 |
| 00000001 | a2 |
| 00000010 | a3 |
| ... | ... |
| 11111111 | a256 |

(256 rows)

| NUMBER OF CONSECUTIVE "0"S | APPEARANCE FREQUENCY |
|---|---|
| 0000 | b1 |
| 0001 | b2 |
| ... | ... |
| 1111 | b16 |

(16 rows)

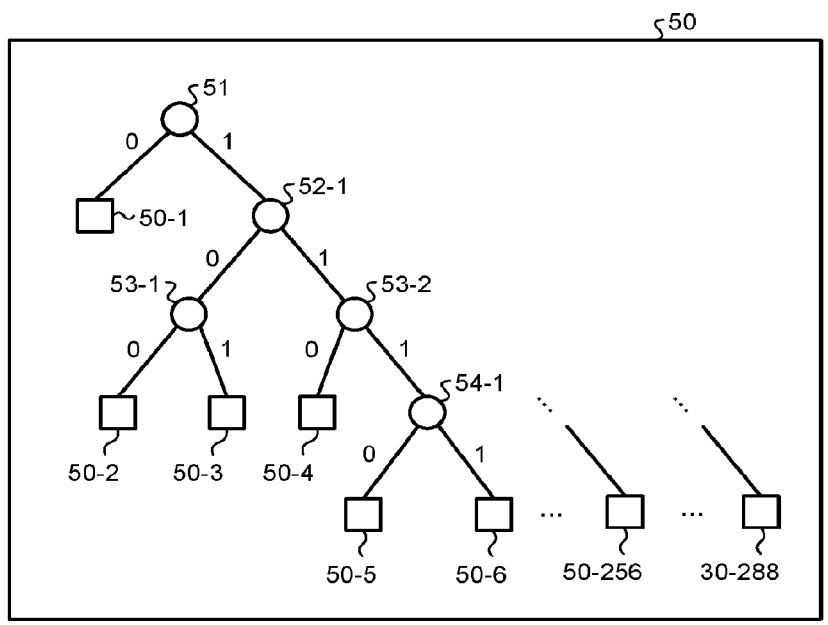

DATA STRUCTURE OF NODE

| POINTER TO HIGHER-ORDER NODE |
|---|
| POINTER TO LEFT LOWER-ORDER NODE OR LEAF |
| POINTER TO RIGHT LOWER-ORDER NODE OR LEAF |

~50a

DATA STRUCTURE OF LEAF

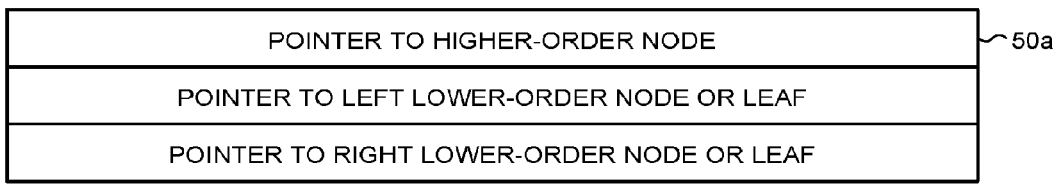

~50b

IDENTIFICATION INFORMATION "0": CHARACTER CODE OR LENGTH OF LONGEST MATCHING CHARACTER STRING
IDENTIFICATION INFORMATION "10": NUMBER OF CONSECUTIVE "0"S
IDENTIFICATION INFORMATION "11": NUMBER OF CONSECUTIVE "1"S

FIG.28

| CHARACTER CODE/ LENGTH | APPEARANCE FREQUENCY |
|---|---|
| 00000000 | a1 |
| 00000001 | a2 |
| 00000010 | a3 |
| ... | ... |
| 11111111 | a256 |

256 rows

| NUMBER OF CONSECUTIVE "0"S | APPEARANCE FREQUENCY |
|---|---|
| 0000 | b1 |
| 0001 | b2 |
| ... | ... |
| 1111 | b16 |

16 rows

| NUMBER OF CONSECUTIVE "1"S | APPEARANCE FREQUENCY |
|---|---|
| 0000 | c1 |
| 0001 | c2 |
| ... | ... |
| 1111 | c16 |

16 rows

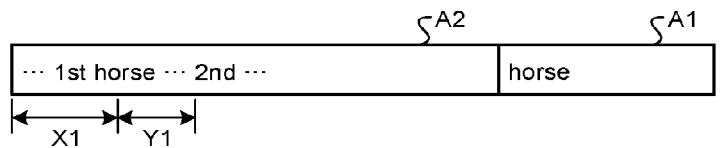

LONGEST MATCHING CHARACTER STRING: horse
X1: 0000000000011010

| NUMBER OF CONSECUTIVE "0"S FOR POSITION (X1) OF LONGEST MATCHING CHARACTER STRING (HUFFMAN CODE) | BIT STRING OF 1 AND SUBSEQUENT DIGITS FOR POSITION (X1) OF LONGEST MATCHING CHARACTER STRING | LENGTH (Y1) OF LONGEST MATCHING CHARACTER STRING (HUFFMAN CODE) | d2

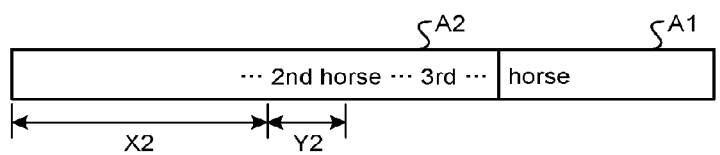

LONGEST MATCHING CHARACTER STRING: horse
X2: 1111110010101010

| NUMBER OF CONSECUTIVE "1"S FOR POSITION (X2) OF LONGEST MATCHING CHARACTER STRING (HUFFMAN CODE) | BIT STRING OF 0 AND SUBSEQUENT DIGITS FOR POSITION (X2) OF LONGEST MATCHING CHARACTER STRING | LENGTH (Y2) OF LONGEST MATCHING CHARACTER STRING (HUFFMAN CODE) | d3

NON-TRANSITORY COMPUTER-READABLE RECORDING MEDIUM, COMPRESSION METHOD, DECOMPRESSION METHOD, COMPRESSION DEVICE, AND DECOMPRESSION DEVICE

CROSS-REFERENCE TO RELATED APPLICATION

This application is based upon and claims the benefit of priority of the prior Japanese Patent Application No. 2015-017617, filed on Jan. 30, 2015, the entire contents of which are incorporated herein by reference.

FIELD

The embodiments discussed herein are related to, for example, a compression program.

BACKGROUND

Techniques are known in which data is searched for the longest matching character string, and the data is compressed according to appearance frequencies in the data. For example, ZIP is a compression technique of performing LZ77-type compression at a first stage and Huffman compression at a second stage.

In the LZ77-type compression performed at the first stage, a sliding window is applied to the data to be transformed, and the longest matching character string search is performed in the sliding window. Then, in the LZ77-type compression, an identification bit for a character or a character string is given to a compression code according to the result of the longest matching character string search, and compression coding is performed. In the following description, data obtained by the longest matching character string search will be expressed as longest matching data.

For example, if the result of the longest matching character string search in the sliding window gives the longest matching data of less than 3 bytes, a code in which an identification bit "0" is associated with a 1-byte character code is output as a compression code. If, in contrast, the longest matching data is 3 bytes or more, a code in which an identification bit "1" is associated with the position and the length of the sliding window of the longest matching data is output as a compression code.

In the Huffman compression performed at the second stage, a Huffman tree according to appearance frequencies of characters is generated, and a Huffman code is assigned to each 1-byte character code associated with the identification bit "0". The length of the longest matching character string is assigned as a compression code to each 1-byte character code associated with the identification bit "1". These related-art examples are described, for example, in Japanese National Publication of International Patent Application No. 2004-514366 and Japanese Laid-open Patent Publication No. 08-288861.

However, in the conventional technique described above, the compression code includes the identification bit, resulting in the problem that a compression rate decreases.

SUMMARY

According to an aspect of an embodiment, a non-transitory computer-readable recording medium stores therein a compressing program that causes a computer to execute a compression process including: searching a certain piece of data for the longest matching character strings; generating frequency information including first frequency information and second frequency information of specific data based on an appearance frequency of each piece of first data and on an appearance frequency of each piece of position information about second data, the first data having a length smaller than a predetermined length among the found longest matching character strings, the second data having a length equal to or larger than the predetermined length among the found longest matching character strings; the first frequency information associating a compression code, first identification information, and the first data, the second frequency including information associating a compression code, second identification information, and a position information; and compressing target data by searching longest matching character string and generating compression codes; wherein, the compression codes are associated with a piece of first data of the longest matching character string among the pieces of first data contained in the frequency information, when the longest matching character string has a length smaller than the predetermined length; and the compression codes are associated with a piece of position information matching with position information about the longest matching character string among the pieces of position information about the second data contained in the frequency information and a compression code associated with length information about the longest matching character string among the pieces of first data contained in the frequency information, or when the longest matching character string has a length equal to or larger than the predetermined length.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIG. 1 is a diagram illustrating a reference example of a Huffman tree;

FIG. 6 is a diagram illustrating a reference example of the data structure of a frequency table;

FIG. 9 is a diagram illustrating an example of an extended Huffman tree;

FIG. 14 is a diagram illustrating an example of the data structure of an extended frequency table;

FIG. 23 is a diagram (2) illustrating another example of the extended Huffman tree;

FIG. 28 is a diagram (2) illustrating another example of the data structure of the extended frequency table;

FIG. 29 is a diagram (2) for explaining processing by a second encoder of the compressing unit;

DESCRIPTION OF EMBODIMENTS

The following describes details of embodiments of a compression program, a compression method, a compression device, and a decompression program that are disclosed in the present application with reference to the accompanying drawings. The embodiments do not limit the invention.

First Embodiment

Before a first embodiment of the present invention is described, reference examples of a compression technique and a decompression technique using LZ77 will be described.

The reference example of the compression technique using LZ77 will be described. In the reference example, a file F1 as a compression target is first referred to, and appearance frequencies of data are tallied. In the reference example, a Huffman tree is generated based on the tally result of the appearance frequencies of the data. For convenience of explanation, the reference examples and the present embodiment will be described below for a case of compressing character strings. However, the compression target is not limited to character strings, but is "data". In other words, the compression and decompression can be applied to compression target data, such as data in which 0s and/or 1s are arranged, that includes no delimiters for characters unlike character strings.

FIG. 1 is a diagram illustrating a reference example of the Huffman tree. A Huffman tree 10 illustrated in FIG. 1 includes a root node 11 at the highest level, nodes 12-1, . . . that are connected by branches, and leaves 10-1 to 10-256 at the lowest levels. The data structure of each of the nodes is illustrated in 10a. The data structure basically stores therein three kinds of pointers, that is, a pointer to a higher-order node, and pointers to right and left lower-order nodes. If neither branches nor nodes are present at the lower level, pieces of data of leaves are stored. The data structure of each of the leaves is illustrated in 10b. For example, a leaf identifier, preliminary information, and a character code or the length of the longest matching character string are stored in each of the leaves. The leaves are arranged in the descending order of the appearance frequencies of the character codes stored in the leaves, and shorter compression data is assigned to a character code having a higher appearance frequency. The Huffman tree of the reference example includes 256 leaves. In the reference examples and the present embodiment, the compression target is character strings, for convenience of explanation, so that the leaf identifier, the preliminary information, and the character code or the length of the longest matching character string are stored in each of the leaves. However, when the compression target is "data", decompressed data is stored instead of the character code.

Figure 2:
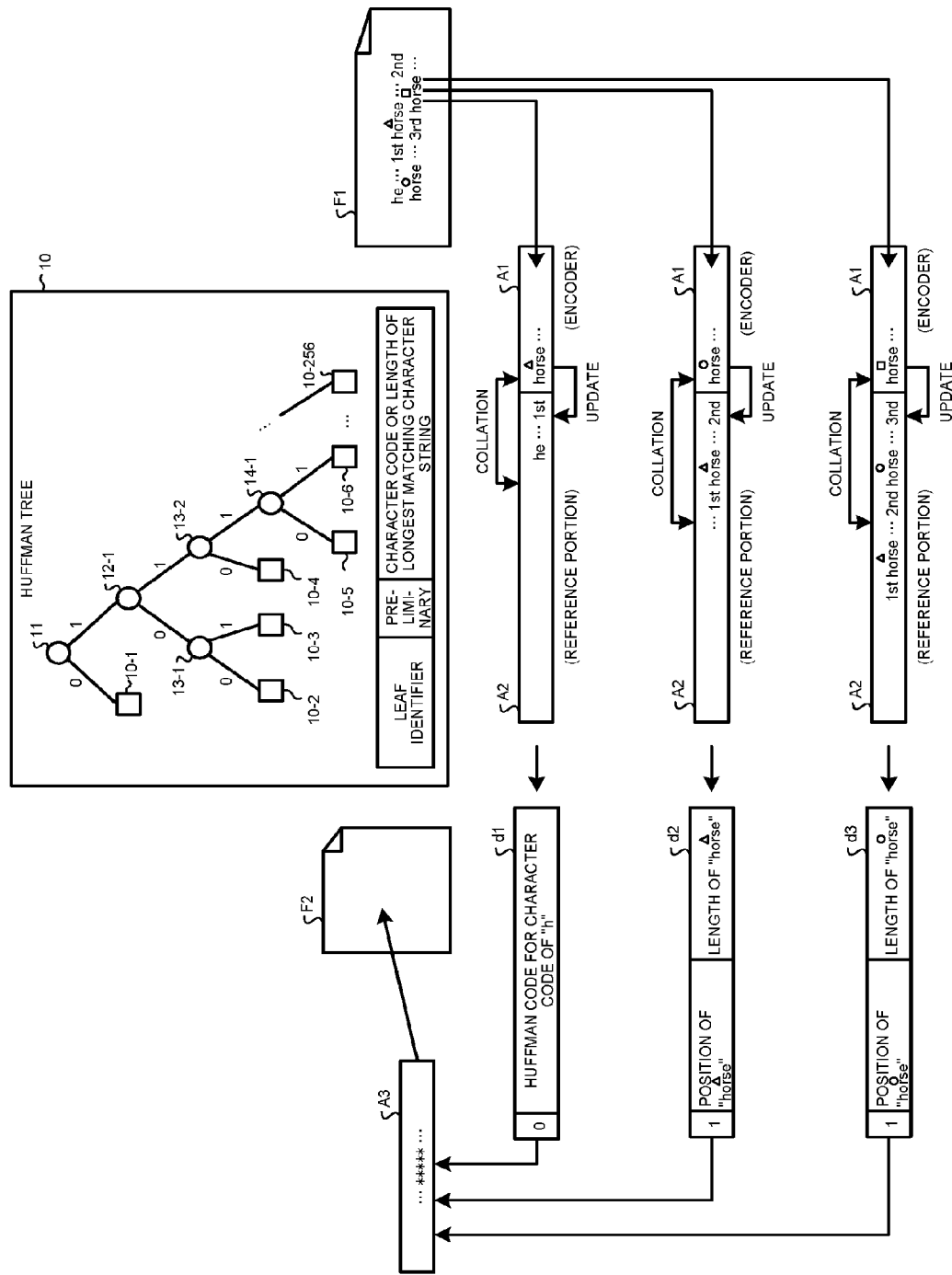
FIG. 2 is a diagram for explaining a reference example of compression processing using LZ77.

FIG. 2 is a diagram for explaining a reference example of compression processing using LZ77. The compression processing illustrated in FIG. 2 is performed after the Huffman tree illustrated in FIG. 1 is generated. First, a storage region A1, a storage region A2, and a storage region A3 are allocated in a memory, for example. Data in a content portion in the file F1 illustrated in FIG. 2 is read into the storage region A1. The storage region A1 is referred to as an encoder, for example. The file F1 contains data "he . . . 1st horse . . . 2nd horse . . . 3rd horse . . . " (" . . . " is an unspecified character string). The symbols of a triangle, a circle, and a square are marked at "horse" in FIG. 2 in order to visually distinguish each character string "horse", for convenience of explanation. The actual file F1 does not contain these symbols.

Generation processing of compression data is performed based on the data read into the storage region A1. Data subjected to the generation processing of the compression data is copied from the storage region A1 to the storage region A2. The storage region A2 is referred to as a reference portion, for example. The compression data is generated according to the result of collation processing between the data read into the storage region A1 and the data in the storage region A2. The generated compression data is sequentially stored in the storage region A3, and a compression file F2 is generated based on the compression data stored in the storage region A3. FIG. 2 schematically illustrates the pieces of data in the storage regions A1 and A2.

Generation of compression data d1 will be described by way of an example of a case in which "h" and the subsequent characters in "1st horse . . . " illustrated in FIG. 2 are data as a processing target. First, the storage region A2 is searched for the longest matching data matching with "horse . . . " ("collation" illustrated in FIG. 2). In the example of FIG. 2, "he . . . 1st" is present, so that "h" corresponds to the longest portion of the data (the longest matching character string) that matches with the data as a processing target in the storage region A2. In the reference example, when the amount of data in the longest matching character string is less than 3 bytes, each 1-byte character is compared with the Huffman tree 10 so as to specify a Huffman code for the character, and the compression data d1 is generated. The compression data d1 contains an identifier "0" indicating that the character is encoded into a Huffman code, in addition to the Huffman code.

Generation of compression data d2 will be described by way of an example of a case in which "h" and the subsequent characters in "2nd horse . . . " illustrated in FIG. 2 are the data as a processing target. First, the storage region A2 is searched for the longest matching data matching with "horse . . . " ("collation" illustrated in FIG. 2). In the example of FIG. 2, "1st horse . . . " is present in the storage region A2, so that, for example, "horse" serving as the data as a processing target matches with "horse" in "1st horse . . . " in the storage region A2. For example, the matching data "horse" in the storage region A2 corresponds to the longest matching character string. When the amount of data in the longest matching character string is 3 bytes or more, the compression data d2 is generated based on the position of the longest matching character string in the storage region A2 and the data length of the longest matching character string. For example, the position of "horse" and the length of "horse" are stored in the compression data d2. The length information for "horse" is compressed based on the Huffman tree 10. The compression data d2 contains an identifier "1" indicating that the compression data d2 is compression data based on the position and the length of the longest matching character string.

Generation of compression data d3 will be described by way of an example of a case in which "h" and the subsequent characters in "3rd horse . . . " illustrated in FIG. 2 are the data as a processing target. First, the storage region A2 is searched for the longest matching data matching with "horse . . . " ("collation" illustrated in FIG. 2). In the example of FIG. 2, "1st horse . . . 2nd horse" is present in the storage region A2, so that, for example, "horse" serving as the data as a processing target matches with "horse" in "1st horse . . . " and "2nd horse . . . " in the storage region A2. For example, "horse" in "1st horse . . . " or "2nd horse . . . " in the storage region A2 corresponds to the longest matching character string. When the amount of data in the longest matching character string is 3 bytes or more, the compression data d3 is generated based on the position of the longest matching character string in the storage region A2 and the data length of the longest matching character string. For example, the position of "horse" and the length of "horse" are stored in the compression data d3. The length information for "horse" is compressed based on the Huffman tree 10. The compression data d3 contains the identifier "1" indicating that the compression data d3 is compression data based on the longest matching character string.

Figure 3:
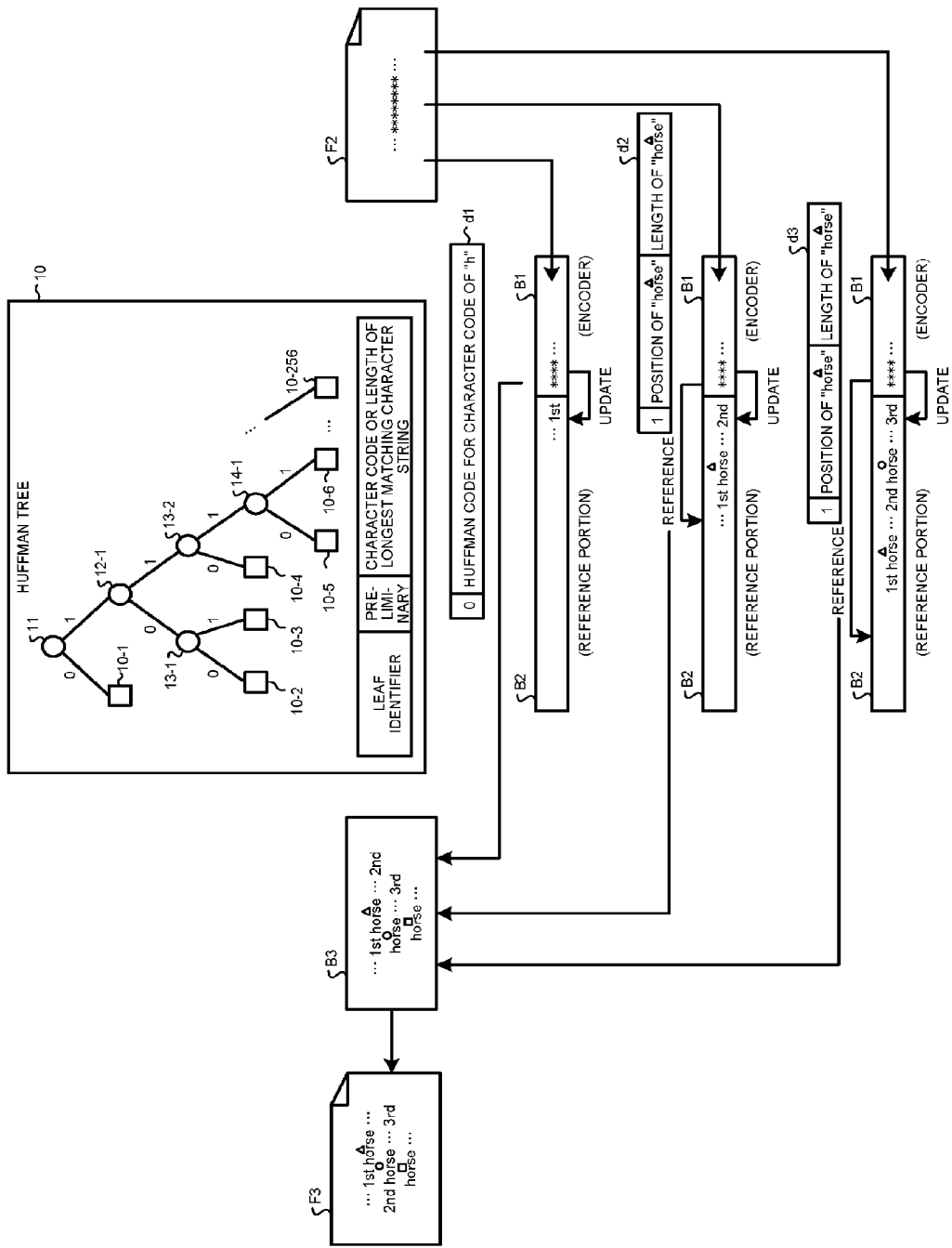
FIG. 3 is a diagram for explaining a reference example of decompression processing using LZ77.

FIG. 3 is a diagram for explaining a reference example of decompression processing using LZ77. In the decompression processing, the compression data in the compression file F2 is loaded in a memory (storage region B1), and generation processing of decompression data is performed according to the identifier of the loaded compression data. The character "*" in FIG. 3 indicates compressed data. The storage region B1 is referred to as an encoder, for example. When the read-out compression data (compression data d1 in FIG. 2) contains the identifier "0" indicating that the compression data is not based on the longest matching character string, a Huffman code for the compression data is compared with the Huffman tree 10 so as to specify a leaf of the Huffman tree 10 corresponding to the compression data, and a character code stored in the specified leaf is generated as the decompression data. The generated decompression data is stored in both a storage region B2 and a storage region B3. The storage region B2 is referred to as a reference portion, for example.

When the read-out compression data (such as the compression data d2 or d3 in FIG. 2) contains the identifier "1" indicating that the compression data is based on the longest matching character string, data in the storage region B2 indicated by the compression data corresponds to the decompression data. The position of the decompression data and the length of the decompression data are stored in the compression data. The length of the decompression data is encoded into a Huffman code based on the Huffman tree 10. Accordingly, the Huffman code stored in the compression data is compared with the Huffman tree 10 so as to specify a corresponding leaf of the Huffman tree 10, and the length of the decompression data is obtained.

For example, the identifier "1", the position of "horse", and the length of "horse" are stored in the compression data d2. Of these pieces of information, the length information for "horse" is encoded into a Huffman code by the Huffman tree 10. Accordingly, a Huffman code for the length of "horse" after being compressed is compared with the Huffman tree 10 so as to specify a leaf. The length information for "horse" after being decoded is stored in the specified leaf. Then, the data "horse" in the storage region B2 corresponding to a position from the start position of the storage region B2 and the length is generated as the decompression data. The generated decompression data is stored in both the storage region B2 and the storage region B3.

For convenience of explanation, the above example has been described for the case of performing the longest matching character string search using the character string. If the compression target is "data", the longest matching character string search is performed between data stored in the storage region B1 and data stored in the storage region B2. The longest piece of data among pieces of matching data is detected as the longest matching character string. The longest matching character string corresponds to data in which 0s and/or 1s are continuously arranged.

Figure 4:
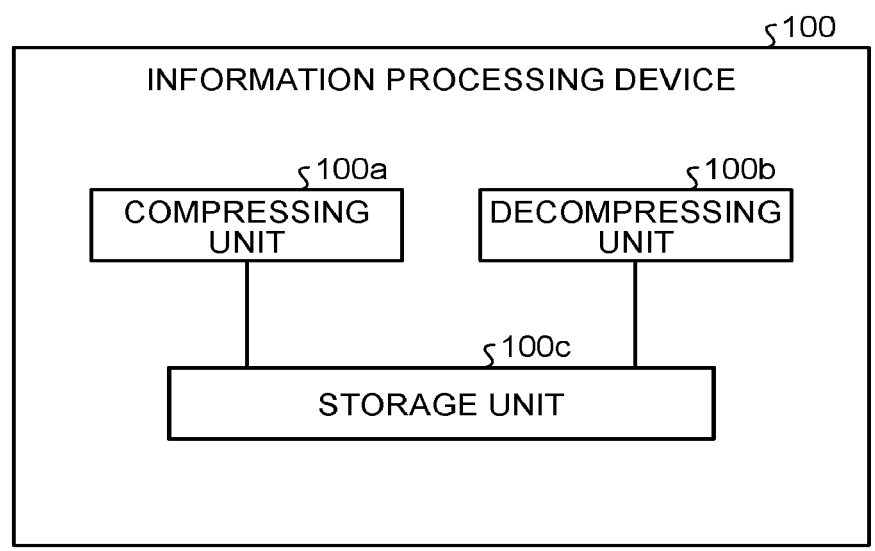
FIG. 4 is a functional block diagram illustrating a reference example of the configuration of an information processing device.

FIG. 4 is a functional block diagram illustrating a reference example of the configuration of an information processing device. As illustrated in FIG. 4, this information processing device 100 includes a compressing unit 100a, a decompressing unit 100b, and a storage unit 100c. The compressing unit 100a is a processor that performs the compression processing illustrated in FIG. 2. The decompressing unit 100b is a processor that performs the decompression processing illustrated in FIG. 3. The storage unit 100c mediates transmission of, for example, the file F1 as a compression target, the compression file F2 obtained by the compression processing, and a file F3 obtained by decompressing the file F2.

Figure 5:
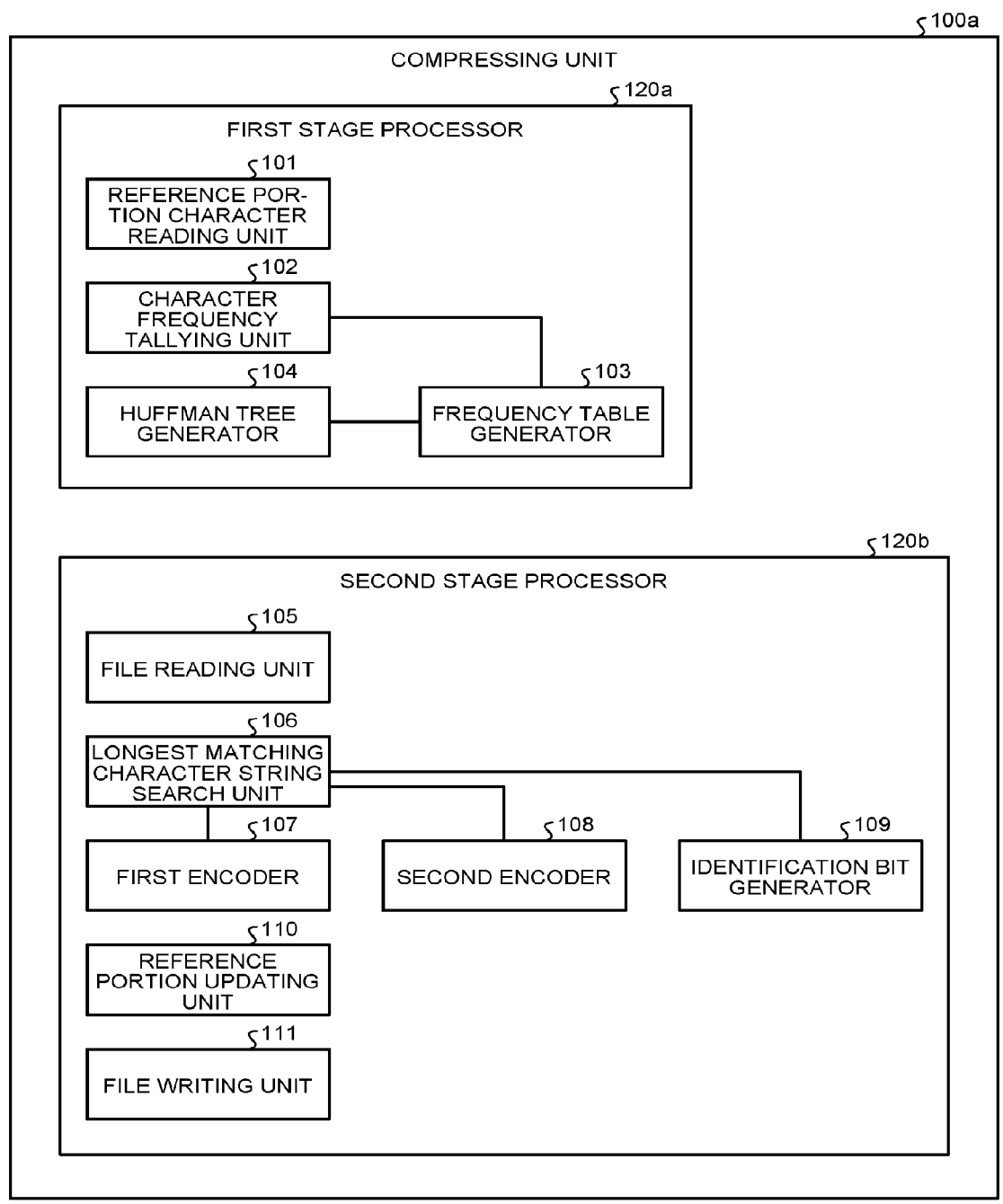
FIG. 5 is a functional block diagram illustrating a reference example of the configuration of a compressing unit.

FIG. 5 is a functional block diagram illustrating a reference example of the configuration of the compressing unit. As illustrated in FIG. 5, the compressing unit 100a includes a first stage processor 120a and a second stage processor 120b. The first stage processor 120a includes a reference portion character reading unit 101, a character frequency tallying unit 102, a frequency table generator 103, and a Huffman tree generator 104. The second stage processor 120b includes a file reading unit 105, a longest matching character string search unit 106, a first encoder 107, a second encoder 108, an identification bit generator 109, a reference portion updating unit 110, and a file writing unit 111.

The first stage processor 120a is a processor that tallies the appearance frequencies of character codes, and forms the Huffman tree. The units included in the first stage processor 120a will be described.

The reference portion character reading unit 101 is a processor that reads out a content portion of the file F1 as a compression target into a predetermined storage region. The predetermined storage region is assumed to be a storage region A4. For example, the storage region A4 is assumed to be present in the storage unit 100c. Each time the tally processing for the file F1 read out in the storage region A4 is completed, the reference portion character reading unit 101 reads out a content portion of a new file F1 to update the information in the storage region.

The character frequency tallying unit 102 is a processor that tallies the appearance frequency of data by referring to the content that has been read out into the storage region A4 by the reference portion character reading unit 101. The character frequency tallying unit 102 outputs the tally result to the frequency table generator 103. The character frequency tallying unit 102 counts the number of appearances of data each time the information in the storage region A4 is updated. For example, the character frequency tallying unit 102 tallies the appearance frequency of data based on the numbers of appearances of all pieces of data and the number of appearances of each piece of data. The following description will be made using character codes, for convenience of explanation.

The frequency table generator 103 is a processor that generates a frequency table based on the tally result of the appearance frequencies of the respective pieces of data acquired from the character frequency tallying unit 102. FIG. 6 is a diagram illustrating a reference example of the data structure of the frequency table. As illustrated in FIG. 6, this frequency table 20 associates character codes or identification numbers for lengths of pieces of the longest matching data with appearance frequencies of the character codes or the lengths. The frequency table 20 has 256 records. The frequency table generator 103 outputs the information in the frequency table 20 to the Huffman tree generator 104.

The Huffman tree generator 104 is a processor that generates the Huffman tree based on the frequency table 20. The Huffman tree generator 104 forms 256 leaf structures, and assigns a "character code (data)" and the "appearance frequency" of the character code (data) to each of the leaf structures. The Huffman tree generator 104 is assumed to have a table indicating a correspondence relation between the identification numbers and the data.

The Huffman tree generator 104 sorts the leaf structures in the descending order of the appearance frequencies of the character codes, and forms "branches" of a binary tree according to the appearance frequencies to build up the binary tree branches toward the higher level so as to generate the Huffman tree. For example, the Huffman tree corresponds to the Huffman tree 10 illustrated in FIG. 1. The Huffman tree generator 104 stores a leaf identifier and either of the character code (data) and the length of the longest matching character string in each leaf of the Huffman tree 10. Addresses of nodes corresponding to pointers to higher-order nodes and pointers to right and left lower-order nodes are also stored.

As described with reference to FIG. 2, the second stage processor 120b is a processor that compresses the file F1. Processing by the respective units included in the second stage processor 120b will be described.

The file reading unit 105 is a processor that reads out data of the content portion in the file F1 into the storage region A1 corresponding to the encoder. After the processing on the data stored in the storage region A1 is finished, the data in the storage region A1 is transferred to the storage region A2 as the reference portion, and the data in the storage region A3 storing therein the compression code is written into the compression file F2, the file reading unit 105 reads out new data from the file F1 and updates the data stored in the storage region A1.

The longest matching character string search unit 106 is a processor that compares the data stored in the storage region A2 as the reference portion with the data stored in the storage region A1 so as to search for the longest matching character string. The processing of searching for the longest matching character string is the same as the processing illustrated in FIG. 2. The longest matching character string search unit 106 outputs the longest matching character string information to the first encoder 107, the second encoder 108, and the identification bit generator 109.

The first encoder 107 performs processing when the amount of data in the longest matching character string is less than 3 bytes. When the amount of data in the longest matching character string is less than 3 bytes, the first encoder 107 compares each 1-byte character code or the binary expression of the data with the Huffman tree 10 so as to specify a Huffman code. The first encoder 107 stores compression data obtained by combining the Huffman code with an identification bit acquired from the identification bit generator 109 in the storage region A3, and outputs the compression data to the file writing unit 111.

The second encoder 108 performs processing when the amount of data in the longest matching character string is 3 bytes or more. When the amount of data in the longest matching character string is 3 bytes or more, the second encoder 108 specifies a position of the longest matching character string from a leading character in the storage region A2 and the matching length of the longest matching character string. The second encoder 108 compares the matching length of the longest matching character string with the Huffman tree 10 so as to specify a Huffman code for the matching length. The second encoder 108 stores compression data obtained by combining the position of the longest matching character string with a Huffman code for the matching length and the identification bit, in the storage region A3, and outputs the compression data to the file writing unit 111.

The identification bit generator 109 is a processor that outputs the identification bit "0" or the identification bit "1" based on the amount of data in the longest matching character string. To be specific, when the amount of data in the longest matching character string is less than 3 bytes, the identification bit generator 109 outputs the identification bit "0". On the other hand, when the amount of data in the longest matching character string is 3 bytes of more, the identification bit generator 109 outputs the identification bit "1".

The reference portion updating unit 110 is a processor that stores, in the storage region A2, data stored in the storage region A1 when collation between the storage region A1 and the storage region A2 has been completed.

When the amount of data in the longest matching character string is less than 3 bytes, the file writing unit 111 writes the compression data obtained by combining the identification bit "0" with the Huffman code output from the first encoder 107 into the storage region A3. When the amount of data in the longest matching data is 3 bytes or more, the file writing unit 111 writes the compression data obtained by combining the identification bit "1" with the position and the length of the longest matching data output from the second encoder 108 into the storage region A3.

The file writing unit 111 writes the data in the storage region A3 into the compression file F2 after the processing on the storage region A1 is finished. After the generation of the frequency table is completed, the file writing unit 111 acquires the frequency table information from the frequency table generator 103, and appends the acquired frequency table information as header information to the compression file F2.

Figure 7:
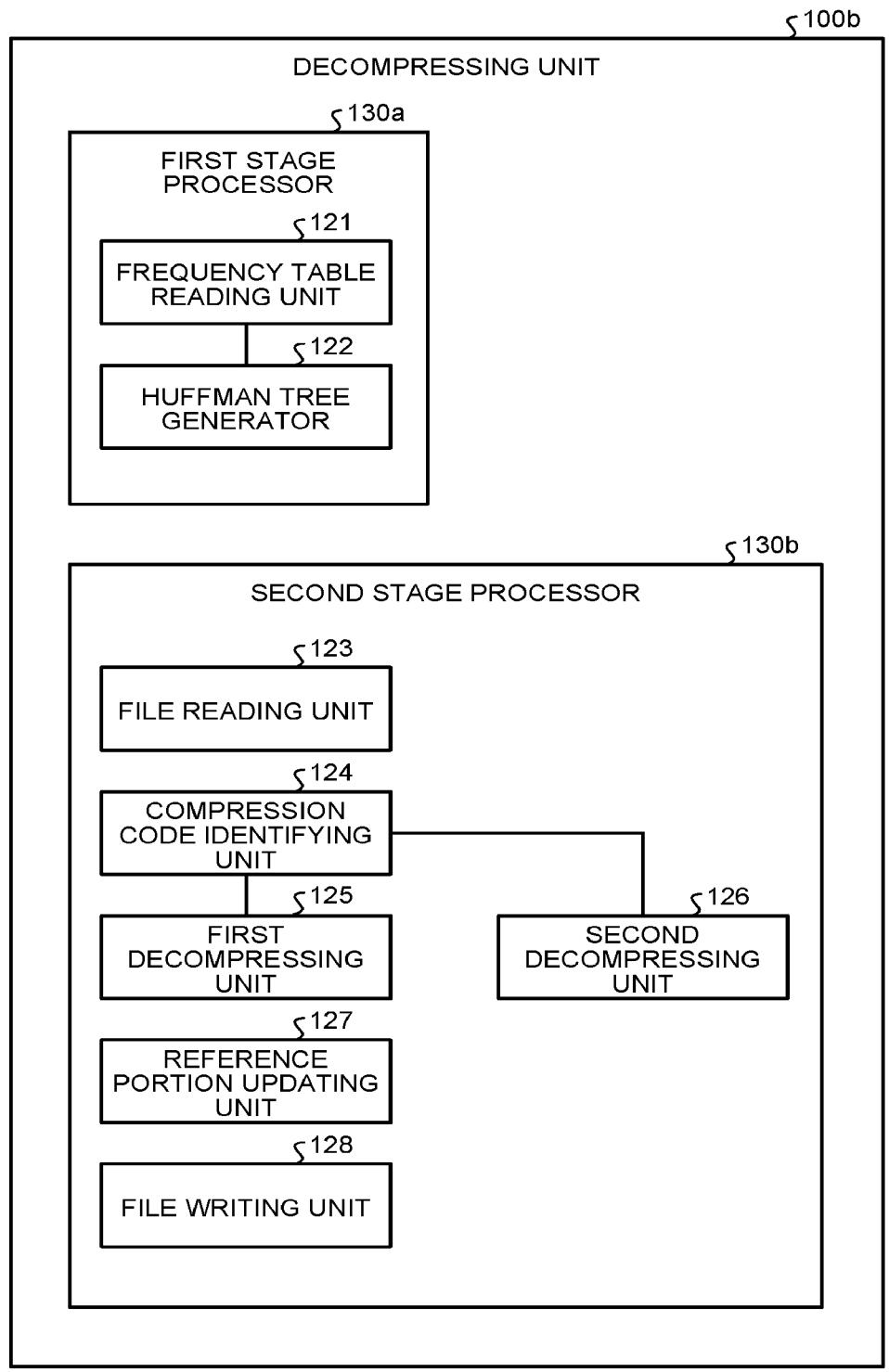
FIG. 7 is a functional block diagram illustrating a reference example of the configuration of a decompressing unit.

Next, an example of the configuration of the decompressing unit 100b will be described. FIG. 7 is a functional block diagram illustrating a reference example of the configuration of the decompressing unit. As illustrated in FIG. 7, the decompressing unit 100b includes a first stage processor 130a and a second stage processor 130b. The first stage processor 130a includes a frequency table reading unit 121 and a Huffman tree generator 122. The second stage processor 130b includes a file reading unit 123, a compression code identifying unit 124, a first decompressing unit 125, a second decompressing unit 126, a reference portion updating unit 127, and a file writing unit 128.

The first stage processor 130a is a processor that generates a Huffman tree based on a frequency table contained in header information of the compression file F2. Individual processors included in the first stage processor 130a are described.

The frequency table reading unit 121 is a processor that reads out the frequency table information, and outputs the read-out information to the Huffman tree generator 122. For example, the frequency table reading unit 121 acquires the frequency table information generated by the frequency table generator 103 of FIG. 5 by reading out the frequency table information.

The Huffman tree generator 122 is a processor that generates a Huffman tree based on the frequency table. The processing of generating the Huffman tree by the Huffman tree generator 122 is the same as that by the Huffman tree generator 104 in FIG. 4.

The second stage processor 130b is a processor that decompresses the compression file F2 as described with reference to FIG. 3. Processing by the respective units included in the second stage processor 130b will be described.

The file reading unit 123 is a processor that reads out compression data in the compression file F2 into the storage region B1. When processing on the compression data stored in the storage region B1 is finished, the file reading unit 123 reads out new compression data from the compression file F2 and updates the compression data stored in the storage region B1.

The compression code identifying unit 124 is a processor that reads out an identifier from the compression data in the storage region B1 and determines whether the identifier is "0" or "1". The compression code identifying unit 124 outputs a determination result to the first decompressing unit 125 and the second decompressing unit 126.

The first decompressing unit 125 performs processing when the identifier of the compression data is "0". The first decompressing unit 125 is a processor that compares a data sequence subsequent to the identifier of the compression data with the Huffman tree 10 and decodes data contained in a leaf reached by following the Huffman tree 10 as decompression data when the identifier is "0". The first decompressing unit 125 stores the decompression data in the storage region B2 as the reference portion and the storage region B3 and outputs the decompression data to the reference portion updating unit 127 and the file writing unit 128.

The second decompressing unit 126 performs processing when the identifier of the compression data is "1". The second decompressing unit 126 extracts decompression data from the storage region B2 since the data in the storage region B2 as the reference portion is the decompression data when the identifier is "1".

The second decompressing unit 126 specifies a position of the longest matching character string from a leading character in the storage region B2 and the length of the longest matching character string in order to extract the decompression data. The position information corresponds to information of a fixed length (16 bits) subsequent to the identifier "1" in the compression data. The length information corresponds to information of a fixed length (8 bits) subsequent to the position information. The length information is Huffman-encoded, and the second decompressing unit 126 compares the Huffman code of the length with the Huffman tree 10 so as to acquire the length information contained in a leaf reached by following the Huffman tree 10.

The second decompressing unit 126 extracts the data corresponding to the position and the length from the storage region B2 as the reference portion, and sets the extracted data as the decompression data. The second decompressing unit 126 stores the decompression data in the storage region B2 as the reference portion and the storage region B3 and outputs the decompression data to the reference portion updating unit 127 and the file writing unit 128.

The reference portion updating unit 127 is a processor that updates the storage region B2 by the decompression data when it has acquired the decompression data from the first decompressing unit 125 or the second decompressing unit 126.

The file writing unit 128 is a processor that stores the decompression data in the storage region B3 and writes the decompression data into the file F3 when it has acquired the decompression data from the first decompressing unit 125 or the second decompressing unit 126.

Figure 8:
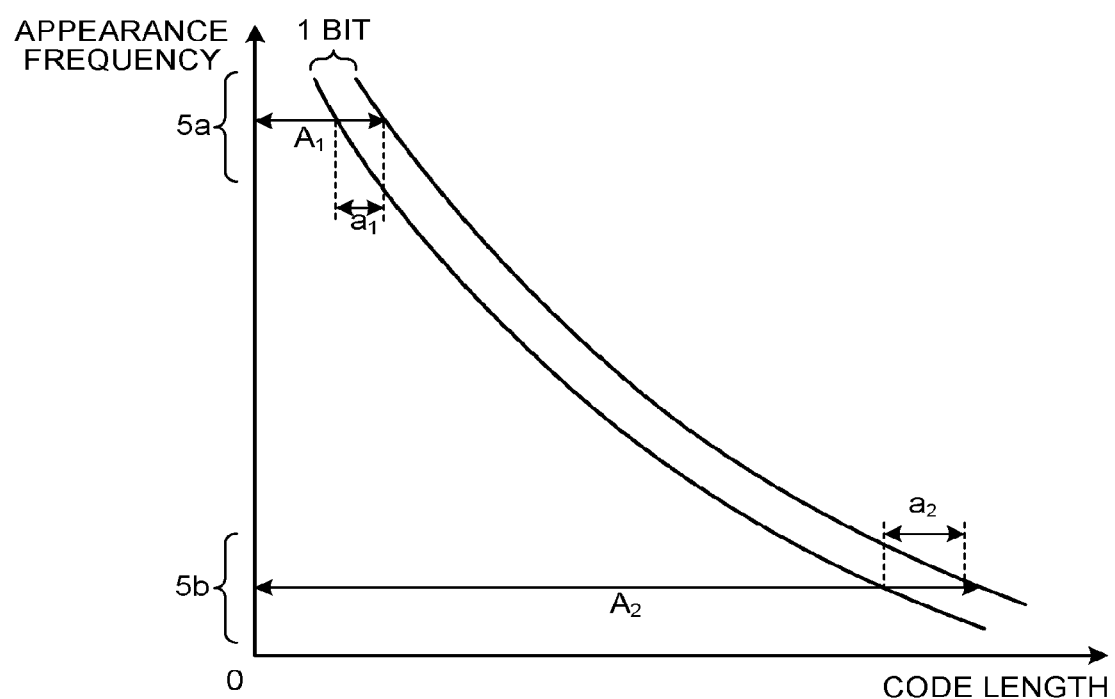
FIG. 8 is a diagram for explaining a problem of the reference examples.

The following describes a problem of the reference examples. FIG. 8 is a diagram for explaining the problem of the reference examples. In FIG. 8, the vertical axis represents the appearance frequency, and the horizontal axis represents the code length of a compression code to be assigned to the data. In the reference examples, a shorter compression code is assigned to data with a higher appearance frequency, in contrast, a longer compression code is assigned to data with a lower appearance frequency, and a 1-bit identifier for distinguishing the decompression method is added regardless of the appearance frequency. For example, in the case of data with an appearance frequency so low as to be contained in the range 5b, the ratio of the identifier to the compression data length is as small as "$a_2/A_2$", so that the addition of the identifier has an insignificant effect on the compression rate. However, in the case of characters with an appearance frequency so high as to be contained in the range 5a, the ratio "$a_1/A_1$" of the identifier to the compression data length is large, and the appearance frequency is high, so that the total compression data length increases, thus causing a reduction in the compression rate.

The following describes compression processing performed by an information processing device according to the present embodiment. First, as first stage processing, the information processing device reads the file F1 as a compression target, tallies the appearance frequencies of data, and generates an extended Huffman tree. Then, as second stage processing, the information processing device reads the file F1, performs the longest matching character string search, performs coding according to the result of the longest matching character string search, and writes the compression file F2. In the first stage processing, the information processing device searches the file F1 for the longest matching character strings by performing the same processing as that of the longest matching character string search unit 106 illustrated in FIG. 2, and specifies the position of each of the longest matching character strings. The information processing device converts the position into the number of consecutive 0s, and tallies the appearance frequencies of the numbers of consecutive 0s. The information processing device tallies the appearance frequencies of the characters or the data on a byte-by-byte basis.

An example of processing of converting the position into the number of consecutive 0s will be described. The information processing device converts the position into a 16-bit binary number, and obtains the number of consecutive 0s by counting the number of 0s continuing from the leading bit. For example, a position "$26_{(10)}$" is expressed as "0000000000011010" in 16-bit binary number. Accordingly, the number of consecutive 0s corresponding to the position "26" is "11".

The information processing device generates an extended Huffman tree 30 based on the appearance frequencies of the data and the appearance frequencies of the numbers of consecutive 0s. FIG. 9 is a diagram illustrating an example of the extended Huffman tree. The extended Huffman tree 30 differs from the Huffman tree 10 in the leaf structures and in that the number of leaves is 272, which is larger by 16 than that of the Huffman tree 10.

The extended Huffman tree 30 illustrated in FIG. 9 includes a root node 31 at the highest level, nodes 32-1, . . . that are connected by branches, and leaves 30-1 to 30-272 at the lowest levels. The data structure of each of the nodes is illustrated in 30a. The data structure basically stores therein three kinds of pointers, that is, a pointer to a higher-order node, and pointers to right and left lower-order nodes. If neither branches nor nodes are present at the lower level, pieces of data of leaves are stored. The data structure of each of the leaves is illustrated in 30b. A leaf identifier, preliminary information, identification information, and information corresponding to the identification information are stored in each of the leaves. For example, when the identification information is "0", the information corresponding to the identification information is either the character code (data) information or the length information about the longest matching character string. When the identification information is "1", the information corresponding to the identification information is the "number of consecutive 0s".

Figure 10:
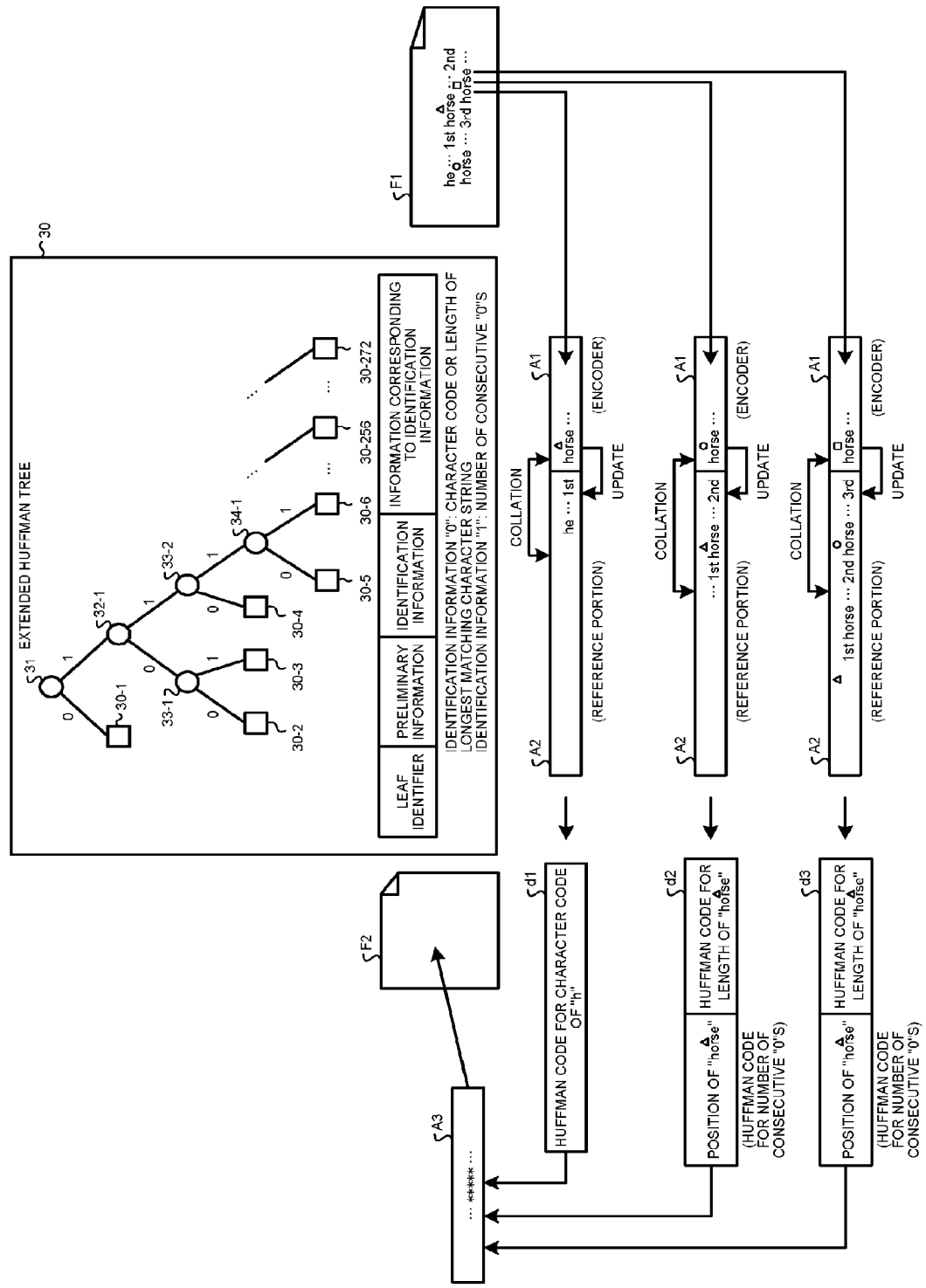
FIG. 10 is a diagram for explaining compression processing according to a first embodiment.

FIG. 10 is a diagram for explaining the compression processing according to the first embodiment. The compression processing illustrated in FIG. 10 is performed after the extended Huffman tree illustrated in FIG. 9 is generated. The information processing device allocates the storage regions A1, A2, and A3 in a storage unit. The storage region A1 is referred to as an encoder, for example. The file F1 contains, for example, data "he . . . 1st horse . . . 2nd horse . . . 3rd horse . . . ".

The information processing device reads the data into the storage region A1, and generates compression data. The information processing device copies the data generated by the compression data generation processing from the storage region A1 to the storage region A2. The storage region A2 is referred to as a reference portion, for example. The compression data is generated according to the result of collation processing between the data read into the storage region A1 and the data in the storage region A2. The information processing device sequentially stores the compression data in the storage region A3, and generates the compression file F2 based on the compression data stored in the storage region A3. Unlike the compressing unit 100a, a compressing unit 200a according to the present embodiment is particularly characterized in that the identifier "0" or the identifier "1" is not added to each piece of the compression data.

An example of the processing will be described in which "horse . . . " is stored in the storage region A1, and "he . . . 1st" is stored in the storage region A2, in FIG. 10. The information processing device compares the data in the storage region A1 with the data in the storage region A2 so as to search for the longest matching character string. For example, if "h" corresponds to the longest characters or data that matches with the data as a processing target in the storage region A2, the information processing device specifies "h" as a 1-byte character or data.

When the longest matching character string has a length of less than 3 bytes, such as in the case of "h", the information processing device performs the following processing. As illustrated in FIG. 10, the information processing device compares the 1-byte character "h" with the extended Huffman tree 30 so as to specify a Huffman code for the character data "h" and generate the compression data d1, and stores the compression data d1 in the storage region A3. The compression data d1 contains no identifier.

An example of the processing will be described in which "horse . . . " is stored in the storage region A1, and " . . . 1st horse . . . 2nd" is stored in the storage region A2, in FIG. 10. The information processing device compares the data in the storage region A1 with the data in the storage region A2 so as to search for the longest matching character string. For example, if "horse" corresponds to the longest data that matches with the data as a processing target in the storage region A2, the information processing device specifies "horse" as the longest matching character string.

When the longest matching character string has a length of 3 bytes or more, such as in the case of "horse", the information processing device performs the following processing. As illustrated in FIG. 10, the information processing device specifies the position of the longest matching character string in the storage region A2 and the data length of the longest matching character string. The information processing device compares the number of consecutive 0s corresponding to the position of the longest matching character string with the extended Huffman tree 30 so as to encode the number of consecutive 0s into a Huffman code. The information processing device also compares the length of the longest matching character string with the extended Huffman tree 30 so as to encode the length into a Huffman code. The information processing device combines the Huffman code for the number of consecutive 0s with the Huffman code for the length to generate the compression data d2, and stores the compression data d2 in the storage region A3. The compression data d2 contains no identifier.

An example of the processing will be described in which "horse . . . " is stored in the storage region A1, and " . . . 1st horse . . . 2nd horse . . . 3rd" is stored in the storage region A2, in FIG. 10. The information processing device compares the data in the storage region A1 with the data in the storage region A2 so as to search for the longest matching character string. For example, if "horse" corresponds to the longest data that matches with the data as a processing target in the storage region A2, the information processing device specifies "horse" as the longest matching character string.

When the longest matching character string has a length of 3 bytes or more, such as in the case of "horse", the information processing device performs the following processing. As illustrated in FIG. 10, the information processing device specifies the position of the longest matching character string in the storage region A2 and the data length of the longest matching character string. The information processing device compares the number of consecutive 0s corresponding to the position of the longest matching character string with the extended Huffman tree 30 so as to encode the number of consecutive 0s into a Huffman code. The information processing device also compares the length of the longest matching character string with the extended Huffman tree 30 so as to encode the length into a Huffman code. The information processing device combines the Huffman code for the number of consecutive 0s with the Huffman code for the length to generate the compression data d3, and stores the compression data d3 in the storage region A3. The compression data d3 contains no identifier.

Figure 11:
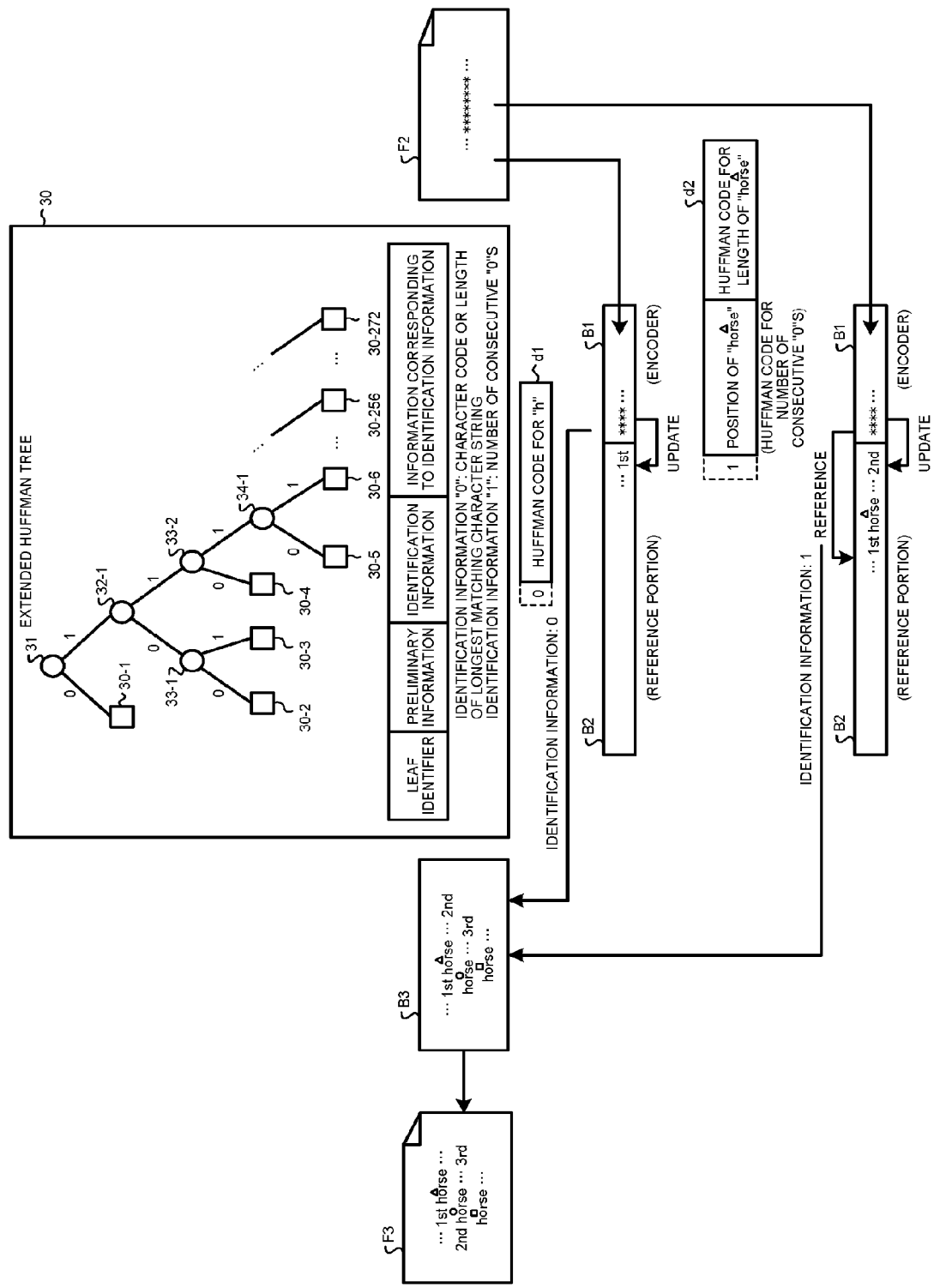
FIG. 11 is a diagram for explaining decompression processing according to the first embodiment.

FIG. 11 is a diagram for explaining decompression processing according to the first embodiment. The information processing device first allocates the storage regions B1, B2, and B3 in the storage unit. The information processing device loads the compression data in the compression file F2 into the storage region B1. A decompressing unit 200b compares the compression data with the extended Huffman tree 30 so as to specify a leaf, and determines whether identification information contained in the leaf is "0" or "1".

When the identification information is "0", the information processing device specifies the data contained in the leaf as decompression data corresponding to the compression data. For example, when the identification information is "0" and the leaf contains "h", the decompression data corresponding to the compression data is "h". The information processing device stores the decompression data "h" in both the storage region B2 and the storage region B3.

When the identification information is "1", the information processing device specifies the position of the longest matching character string based on the number of consecutive 0s contained in the specified leaf. After specifying the position of the longest matching character string, the information processing device compares the subsequent portion of the compression data with the extended Huffman tree 30 so as to specify a leaf, and specifies the length of the longest matching character string contained in the specified leaf. The information processing device refers to the storage region B2, and acquires the data "horse" corresponding to the position and the length of the longest matching character string from the storage region B2. The acquired data "horse" is the decompression data corresponding to the compression data. The information processing device transmits the decompression data "horse" to both the storage region B2 and the storage region B3.

Figure 12:
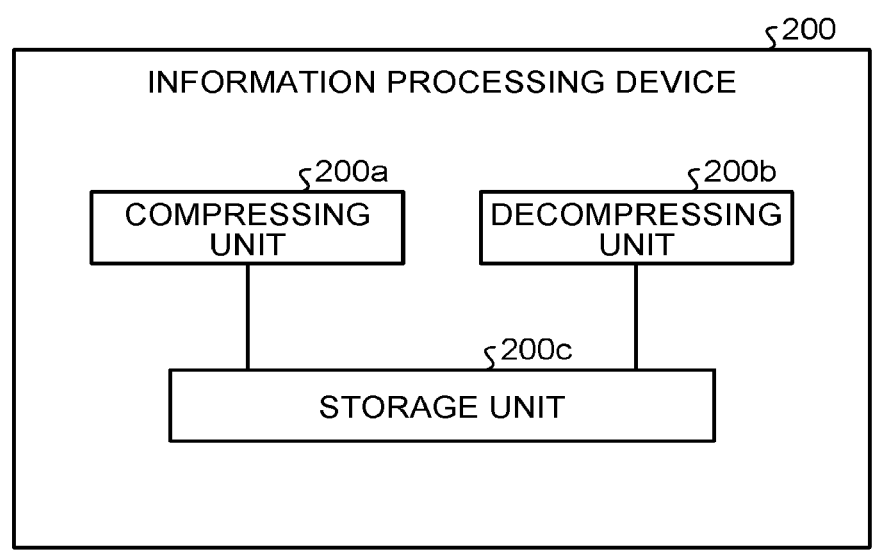
FIG. 12 is a diagram illustrating the configuration of an information processing device according to the first embodiment.

FIG. 12 is a diagram illustrating the configuration of the information processing device according to the first embodiment. As illustrated in FIG. 12, this information processing device 200 includes the compressing unit 200a, the decompressing unit 200b, and a storage unit 200c. The compressing unit 200a is a processor that performs the compression processing illustrated in FIG. 10. The decompressing unit 200b is a processor that performs the decompression processing illustrated in FIG. 11. The storage unit 200c stores therein, for example, the file F1 as a compression target, the compression file F2 obtained by the compression processing, and the file F3 obtained by decompressing the file F2.

Figure 13:
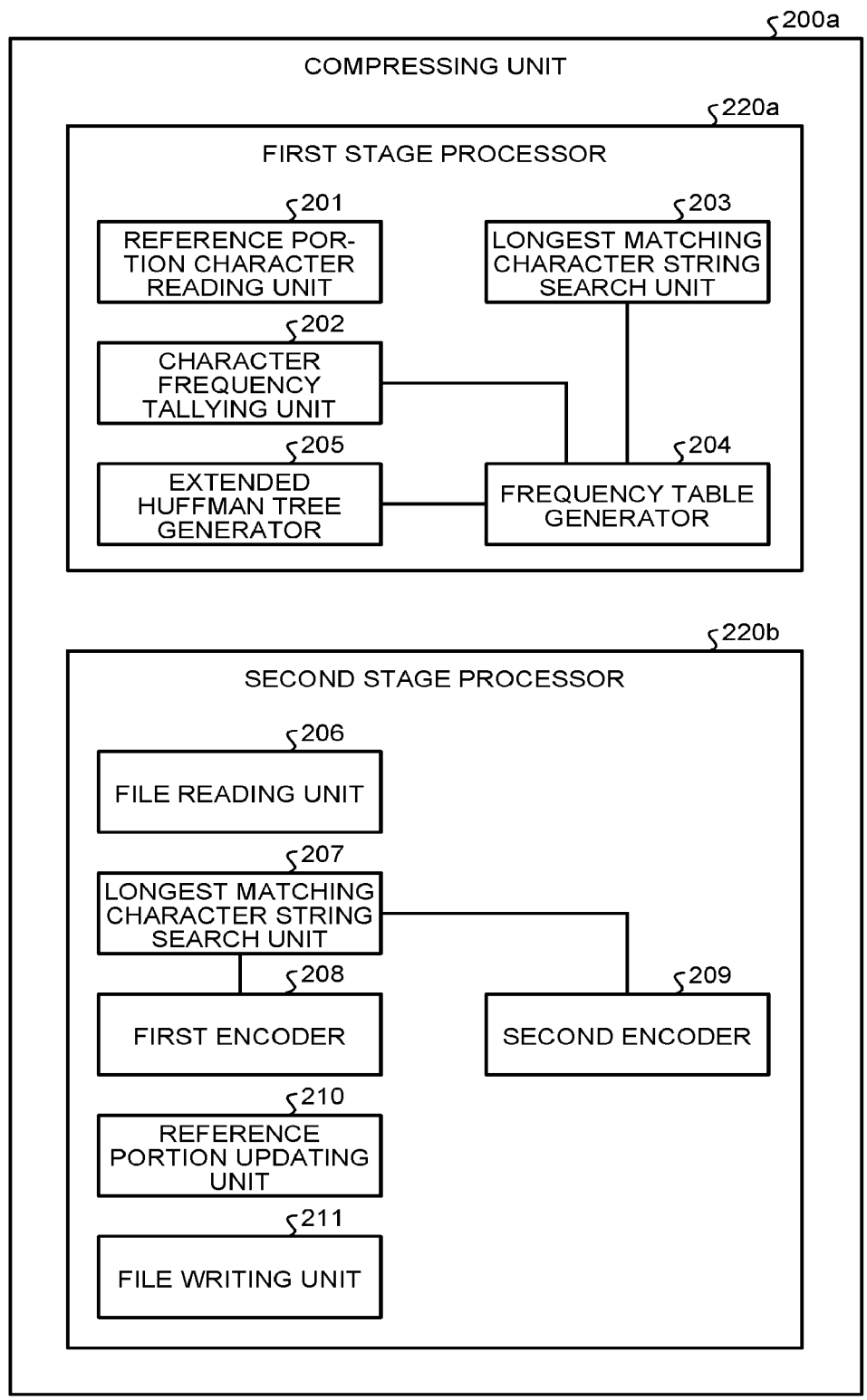
FIG. 13 is a functional block diagram illustrating the configuration of a compressing unit according to the first embodiment.

FIG. 13 is a functional block diagram illustrating the configuration of the compressing unit according to the first embodiment. As illustrated in FIG. 13, the compressing unit 200a includes a first stage processor 220a and a second stage processor 220b. The first stage processor 220a includes a reference portion character reading unit 201, a character frequency tallying unit 202, a longest matching character string search unit 203, a frequency table generator 204, and an extended Huffman tree generator 205. The second stage processor 220b includes a file reading unit 206, a longest matching character string search unit 207, a first encoder 208, a second encoder 209, a reference portion updating unit 210, and a file writing unit 211.

The reference portion character reading unit 201 is a processor that reads out a content portion of the file F1 as a compression target into a predetermined storage region. The reference portion character reading unit 201 reads out the content portion of the file F1 as a compression target into, for example, the storage region A1. After the longest matching character string search unit 203 has completed to search for the longest matching data (to be described later), the reference portion character reading unit 201 copies the data stored in the storage region A1 to the storage region A2, then reads out new data from the file F1, and stores the new data in the storage region A1.

The reference portion character reading unit 201 reads out a content portion of the file F1 as a compression target into, for example, the storage region A4. After the character frequency tallying unit 202 has completed to tally characters (to be described later), the reference portion character reading unit 201 stores the subsequent content portion of the file F1 in the storage region A4.

The character frequency tallying unit 202 is a processor that tallies the appearance frequency of each piece of data by referring to the data stored in, for example, the storage region A4. The character frequency tallying unit 202 outputs the appearance frequency information about each piece of data to the frequency table generator 204. The character frequency tallying unit 202 counts the number of appearances of data each time the data in the storage region A4 is updated. For example, the character frequency tallying unit 202 tallies the appearance frequency of data based on the numbers of appearances of all pieces of data and the number of appearances of each piece of data.

The longest matching character string search unit 203 is a processor that compares the data stored in the storage region A2 as the reference portion with the data stored in the storage region A1 as the encoder so as to search for the longest matching character string. The processing of searching for the longest matching character string is the same as that performed by the longest matching character string search unit 106 illustrated in FIG. 5.

The longest matching character string search unit 203 converts the position of the longest matching character string into the number of consecutive 0s. Specifically, the longest matching character string search unit 203 converts the position into a 16-bit binary number, and calculates the number of consecutive 0s by counting the number of 0s continuing from the leading bit. For example, a position "$26_{(10)}$" is expressed as "0000000000011010" in 16-bit binary number. Accordingly, the number of consecutive 0s corresponding to the position "26" is "11".

Each time the data in the storage region A1 is updated, the longest matching character string search unit 203 calculates the number of consecutive 0s for the position of the longest matching character string, and calculates the appearance frequencies of the respective numbers of consecutive 0s. The longest matching character string search unit 203 outputs the appearance frequency information about the respective numbers of consecutive 0s to the frequency table generator 204.

The frequency table generator 204 is a processor that generates an extended frequency table based on the appearance frequencies of the respective pieces of data and the appearance frequencies of the numbers of consecutive 0s. The frequency table generator 204 outputs the extended frequency table information to the extended Huffman tree generator 205. FIG. 14 is a diagram illustrating an example of the data structure of the extended frequency table. As illustrated in FIG. 14, this extended frequency table 40 associates the character codes (data)/lengths with the appearance frequencies thereof, and also associates the numbers of consecutive 0s with the appearance frequencies thereof. The number of records associating the character codes (data)/lengths with the appearance frequencies thereof is 256. The number of records associating the numbers of consecutive 0s with the appearance frequencies thereof is 16. A number for a character code (data)/length corresponds to a number or a length corresponding to a predetermined character code.

The frequency table generator 204 stores, as the first to 256th records of the frequency table 40, the appearance frequency information about the respective pieces of data acquired from the character frequency tallying unit 202. The frequency table generator 204 stores, as the 257th to 272th records, the appearance frequency information about the numbers of consecutive 0s acquired from the longest matching character string search unit 203.

The extended Huffman tree generator 205 is a processor that generates the extended Huffman tree 30 based on the extended frequency table 40. The data structures of the extended Huffman tree 30 corresponds to the extended Huffman tree 30 illustrated in FIG. 9.

The extended Huffman tree generator 205 generates 256 leaf structures in each of which a leaf identifier, preliminary information, the identification information "0", and a character or the length of the longest matching character string are associated with one another. The extended Huffman tree generator 205 generates 16 leaf structures in each of which a leaf identifier, preliminary information, identification information "1", and the number of consecutive 0s are associated with one another. The extended Huffman tree generator 205 compares the character codes (data) or the numbers of consecutive 0s contained in the leaf structures with those in the frequency table 40 so as to specify the appearance frequencies of the respective leaf structures.

The extended Huffman tree generator 205 sorts the leaf structures in the descending order of the appearance frequencies of the character codes or the numbers of consecutive 0s, and forms "branches" of a binary tree according to the appearance frequencies to build up the binary tree branches toward the higher level so as to generate the Huffman tree.

As described with reference to FIG. 10, the second stage processor 220b is a processor that compresses the file F1. Processing by the respective units included in the second stage processor 220b will be described.

The file reading unit 206 is a processor that reads out the data in the content portion in the file F1 into the storage region A1 corresponding to the encoder. The file reading unit 206 reads out new data from the file F1 and updates the data stored in the storage region A1 after the processing on the data stored in the storage region A1 is finished, the data in the storage region A1 is transferred to the reference portion A2, and the data in the storage region A3 storing therein the compression code is written into the compression file F2.

The longest matching character string search unit 207 is a processor that compares the compression data stored in the storage region A2 as the reference portion with the data stored in the storage region A1 so as to search for the longest matching character string. The processing of searching for the longest matching character string is the same as the processing illustrated in FIG. 10. The longest matching character string search unit 207 outputs the longest matching character string information to the first and the second encoders 208 and 209.

The first encoder 208 performs the processing when the amount of data in the longest matching character string is less than 3 bytes. When the amount of data in the longest matching character string is less than 3 bytes, the first encoder 208 compares each 1-byte character code or the binary expression of the data with the extended Huffman tree 30 so as to specify a Huffman code. The first encoder 208 stores the Huffman code in the storage region A3, and outputs the Huffman code to the file writing unit 211. The Huffman code itself serves as compression data.

Figure 15:
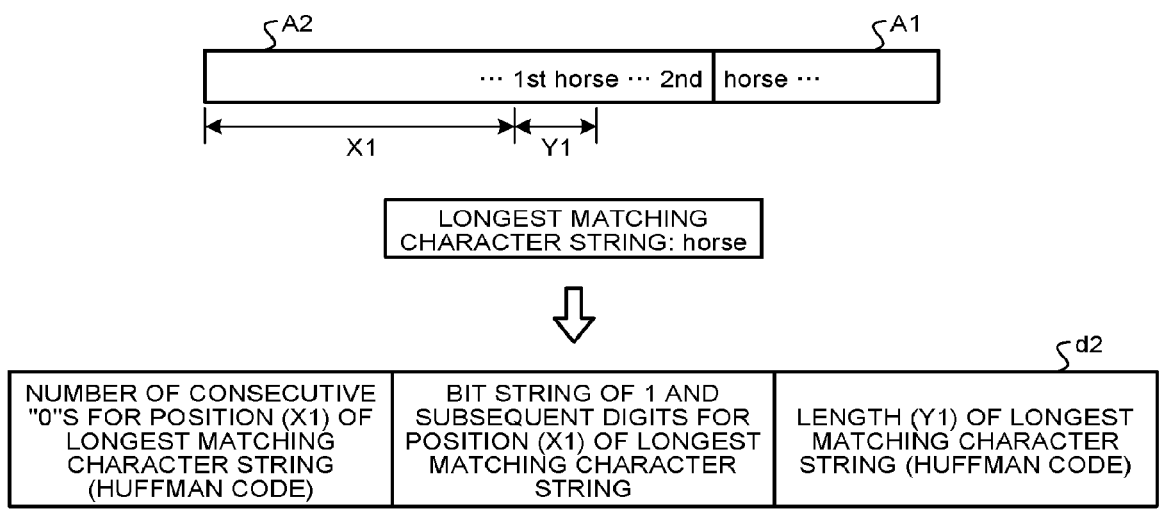
FIG. 15 is a diagram for explaining processing by a second encoder of the compressing unit.

FIG. 15 is a diagram (1) for explaining processing by the second encoder of the compressing unit. The second encoder 209 performs processing when the amount of data in the longest matching character string is 3 bytes or more. Assume that "horse . . . " is stored in the storage region A1, " . . . 1st horse . . . 2nd" is stored in the storage region A2, and "horse" is the longest matching character string, as illustrated in FIG. 15.

When the amount of data in the longest matching character string is 3 bytes or more, the second encoder 208 specifies a position of the longest matching character string from a leading character in the storage region A2 and the matching length of the longest matching character string. In the example illustrated in FIG. 15, the position of the longest matching character string is "X1", and the length of the longest matching character string is "Y1".

The second encoder 209 specifies the "number of consecutive 0s" and a "bit string of 1 and subsequent digits" obtained when the position "X1" of the longest matching character string is expressed in 16-bit binary number. The second encoder 209 compares the "number of consecutive 0s" with the extended Huffman tree 30 so as to obtain a Huffman code for the "number of consecutive 0s". The second encoder 209 also compares the length "Y1" of the longest matching character string with the extended Huffman tree 30 so as to obtain a Huffman code for the length "Y1" of the longest matching character string.

The second encoder 209 generates the compression data d2 by combining the Huffman code for the "number of consecutive 0s" for the position of the longest matching character string, the "bit string of 1 and subsequent digits" for the position of the longest matching character string, and the Huffman code for the "length" of the longest matching character string. The second encoder 209 stores the compression data d2 in the storage region A3, and outputs the compression data d2 to the file writing unit 211.

The reference portion updating unit 210 is a processor that stores the data stored in the storage region A1 into the storage region A2 when the collation between the storage region A1 and the storage region A2 has been completed.

When the amount of data in the longest matching character string is less than 3 bytes, the file writing unit 211 writes the compression data output from the first encoder 208 into the storage region A3. When the amount of data in the longest matching data is 3 bytes or more, the file writing unit 211 writes the compression data output from the second encoder 209 into the storage region A3.

The file writing unit 211 writes the data in the storage region A3 into the compression file F2 after the processing on the storage region A1 is finished. After the generation of the frequency table is completed in the first stage processing, the file writing unit 211 acquires the frequency table information from the frequency table generator 204, and appends the acquired frequency table information as header information to the compression file F2.

Figure 16:
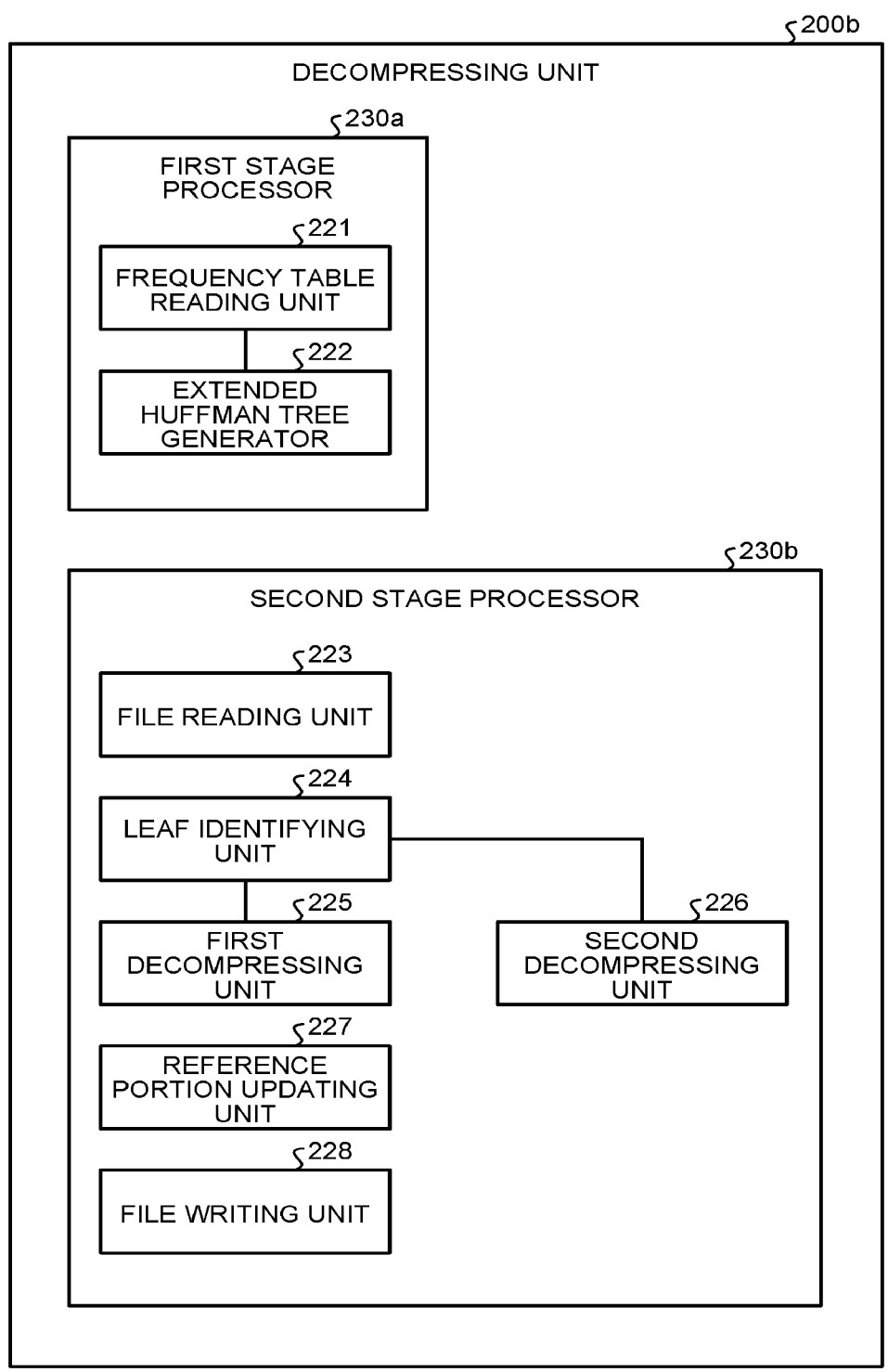
FIG. 16 is a functional block diagram illustrating the configuration of a decompressing unit according to the first embodiment.

FIG. 16 is a functional block diagram illustrating the configuration of the decompressing unit according to the present embodiment. As illustrated in FIG. 16, the decompressing unit 200b includes a first stage processor 230a and a second stage processor 230b. The first stage processor 230a includes a frequency table reading unit 221 and an extended Huffman tree generator 222.

The first stage processor 230a is a processor that generates the extended Huffman tree 30 based on the information in the extended frequency table 40 contained in the header information in the compression file F2. The units included in the first stage processor 230a will be described.

The frequency table reading unit 221 is a processor that reads out the information in the extended frequency table 40, and outputs the read-out information to the extended Huffman tree generator 222. For example, the extended frequency table information corresponds to the extended frequency table information generated by the frequency table generator 204 of FIG. 13.

The extended Huffman tree generator 222 is a processor that generates the extended Huffman tree 30 based on the extended frequency table 40. The processing of generating the extended Huffman tree 30 by the extended Huffman tree generator 222 is the same as the processing of generating the extended Huffman tree 30 by the extended Huffman tree generator 205 of FIG. 13.

As described with reference to FIG. 11, the second stage processor 230b is a processor that decompresses the compression file F2. Processing by respective units included in the second stage processor 230b will be described.

A file reading unit 223 is a processor that reads out compression data in the compression file F2 into the storage region B1. When processing on the compression data stored in the storage region B1 is finished, the file reading unit 223 reads out new compression data from the compression file F2 and updates the compression data stored in the storage region B1.

A leaf identifying unit 224 is a processor that compares the compression data stored in the storage region B1 with the extended Huffman tree 30 so as to specify a leaf by following the extended Huffman tree 30. The leaf identifying unit 224 outputs the specified leaf information to a first decompressing unit 225 and a second decompressing unit 226.

The first decompressing unit 225 performs processing when the identification information contained in the leaf is "0". When the identification information is "0", the leaf contains character code (data) information, as described with reference to FIG. 9. The first decompressing unit 225 extracts the character code (data) information contained in the leaf. The first decompressing unit 225 stores, as decompression data, the extracted character code (data) information in the storage region B2 as the reference portion and in the storage region B3, and outputs the character code (data) information to a file writing unit 228.

The second decompressing unit 226 performs processing when the identification information contained in the leaf is "1". When the identification information is "1", the leaf contains the "number of consecutive 0s", as described with reference to FIG. 9. The second decompressing unit 226 restores the position of the longest matching character string based on the "number of consecutive 0s".

Figure 17:
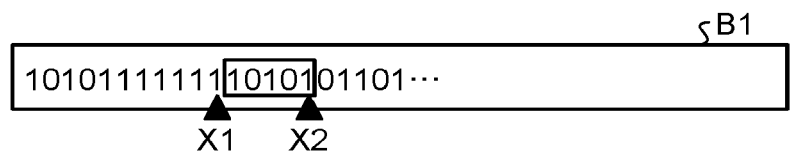
FIG. 17 is a diagram for explaining processing by a second decompressing unit.

FIG. 17 is a diagram (1) for explaining the processing by the second decompressing unit. FIG. 17 assumes that the compression data contained in the storage region B1 has been compared with the extended Huffman tree 30, and a pointer has moved to a position X1 in the storage region B1. The position of the longest matching character string has been converted into a 16-bit binary number, so that, if the "number of consecutive 0s" is "11", the bit string of 1 and subsequent digits has a bit length of "5 bits". Accordingly, the second decompressing unit 226 restores the bit string "10101" ranging from a position next to the position X1 to a position X2 advanced therefrom by 5 bits, as the position of the longest matching character string.

The second decompressing unit 226 compares bits after the position X2 with the extended Huffman tree 30 so as to specify a leaf of the extended Huffman tree 30, and specifies the length of the longest matching character string contained in the specified leaf. The second decompressing unit 226 performs the processing described above so as to specify the position and the length of the longest matching character string. The second decompressing unit 226 extracts data corresponding to the position and the length from the storage region B2, and sets the extracted data as the decompression data. The second decompressing unit 226 stores the decompression data in the storage region B2 as the reference portion and in the storage region B3, and outputs the decompression data to a reference portion updating unit 227 and the file writing unit 228.

The reference portion updating unit 227 is a processor that updates the storage region B2 by the decompression data when it has acquired the decompression data from the first decompressing unit 225 or the second decompressing unit 226.

The file writing unit 228 is a processor that stores the decompression data in the storage region B3 and writes the decompression data into the file F3 when it has acquired the decompression data from the first decompressing unit 225 or the second decompressing unit 226.

Figure 18:
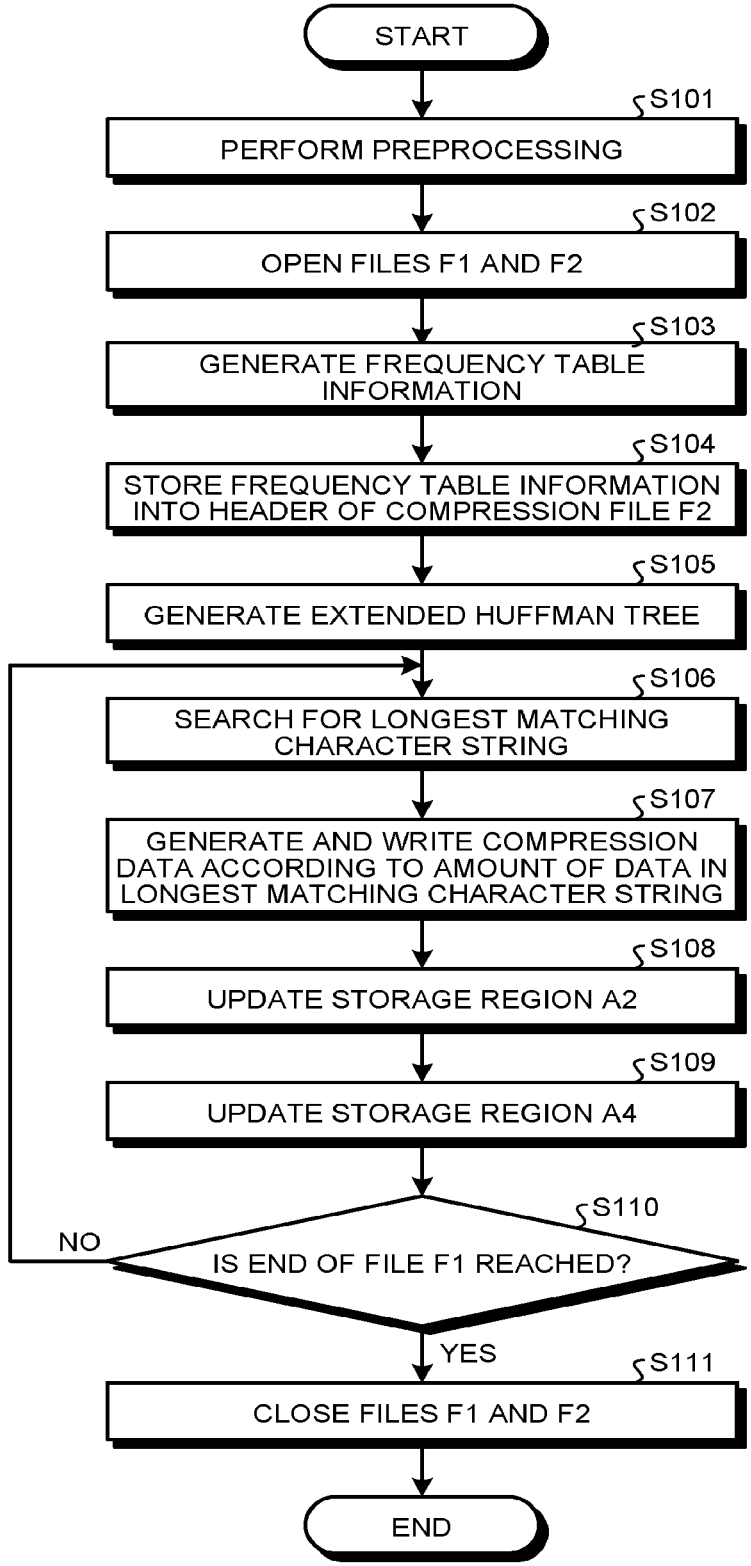
FIG. 18 is a flowchart illustrating a processing procedure of the compressing unit according to the first embodiment.

FIG. 18 is a flowchart illustrating a processing procedure of the compressing unit according to the first embodiment. As illustrated in FIG. 18, the compressing unit 200a performs preprocessing (Step S101). In the preprocessing at Step S101, the compressing unit 200a allocates the storage regions A1, A2, and A3 in the storage unit 200c.

The compressing unit 200*a* opens the files F1 and F2 (Step S102), reads the file F1, and tallies the appearance frequencies of characters so as to generate the frequency table information (Step S103). The compressing unit 200*a* stores the information in the frequency table 40 into the header of the compression file F2 (Step S104). The compressing unit 200*a* generates the extended Huffman tree 30 based on the information in the frequency table 40 (Step S105).

The compressing unit 200*a* searches for the longest matching character string (Step S106), and generates and writes the compression data according to the amount of data in the longest matching character string (Step S107). The compressing unit 200*a* updates the storage region A2 (Step S108), and updates the storage region A4 (Step S109).

The compressing unit 200*a* determines whether the end of the file F1 is reached (Step S110). If not (No at Step S110), the compressing unit 200*a* performs the processing at Step S106.

If so (Yes at Step S110), the compressing unit 200*a* closes the compression file F1 and F2 (Step S111).

The following specifically describes a procedure of processing for generating the frequency table 40 and processing for generating the extended Huffman tree 30 indicated at Step S103 and Step S104 in FIG. 18.

Figure 19:
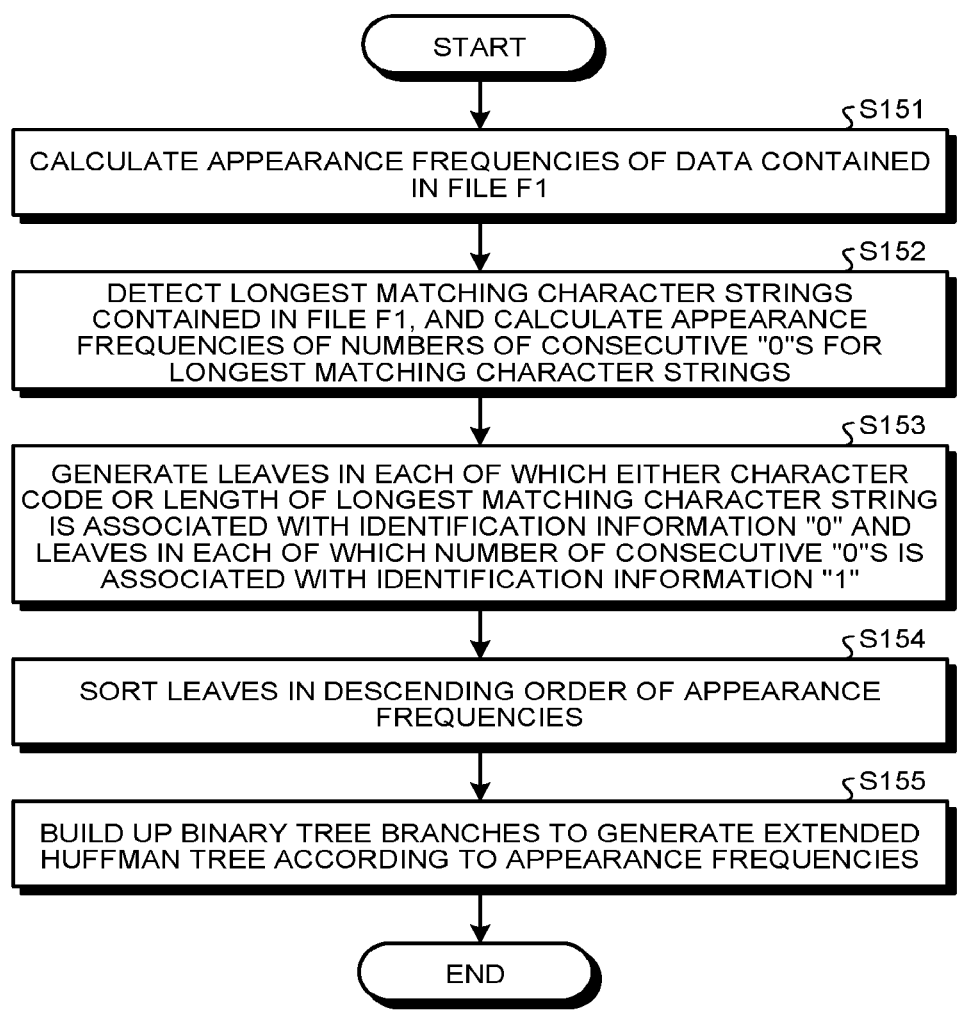
FIG. 19 is a flowchart illustrating a processing procedure for generating the frequency table and the extended Huffman tree.

FIG. 19 is a flowchart (1) illustrating the processing procedure for generating the frequency table and the extended Huffman tree. As illustrated in FIG. 19, the compressing unit 200*a* calculates the appearance frequencies of the data contained in the file F1 (Step S151). The compressing unit 200*a* detects the longest matching character strings contained in the file F1, and calculates the appearance frequencies of the numbers of consecutive 0s for the longest matching character strings (Step S152).

The compressing unit 200*a* generates leaves in each of which either the character code (data) or the length of the longest matching character string is associated with the identification information "0" and generates leaves in each of which the number of consecutive 0s is associated with the identification information "1" (Step S153). The compressing unit 200*a* sorts the leaves in the descending order of the appearance frequencies (Step S154).

The compressing unit 200*a* builds up the binary tree branches to generate the extended Huffman tree 30 based on the appearance frequencies (Step S155).

The following specifically describes a processing procedure for generating the compression data indicated at Step S107 of FIG. 18.

Figure 20:
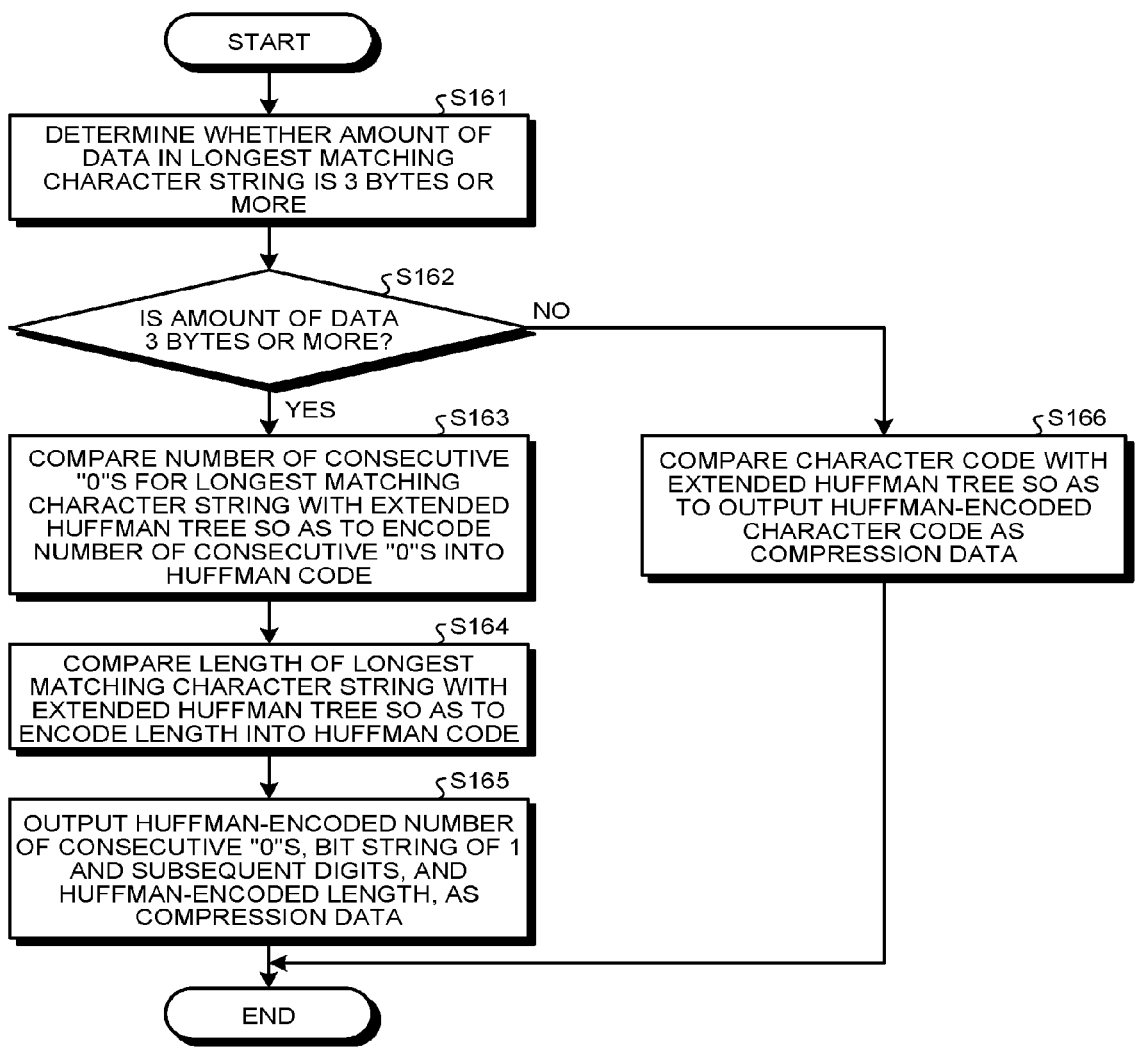
FIG. 20 is a flowchart illustrating a processing procedure for generating compression data.

FIG. 20 is a flowchart (1) illustrating the processing procedure for generating the compression data. The compressing unit 200*a* determines whether the amount of data in the longest matching character string is 3 bytes or more (Step S161), as illustrated in FIG. 20.

If so (Yes at Step S162), the compressing unit 200*a* compares the number of consecutive 0s for the longest matching character string with the extended Huffman tree 30 so as to encode the number of consecutive 0s into a Huffman code (Step S163).

The compressing unit 200*a* compares the length of the longest matching character string with the extended Huffman tree 30 so as to encode the length into a Huffman code (Step S164). The compressing unit 200*a* outputs the Huffman-encoded number of consecutive 0s, the bit string of 1 and subsequent digits, and the Huffman-encoded length, as the compression data (Step S165).

If the amount of data in the longest matching character string is less than 3 bytes (No at Step S162), the compressing unit 200*a* compares the character code (data) with the extended Huffman tree 30 so as to encode the character code (data) into a Huffman code, and outputs the Huffman code as the compression data (Step S166).

Figure 21:
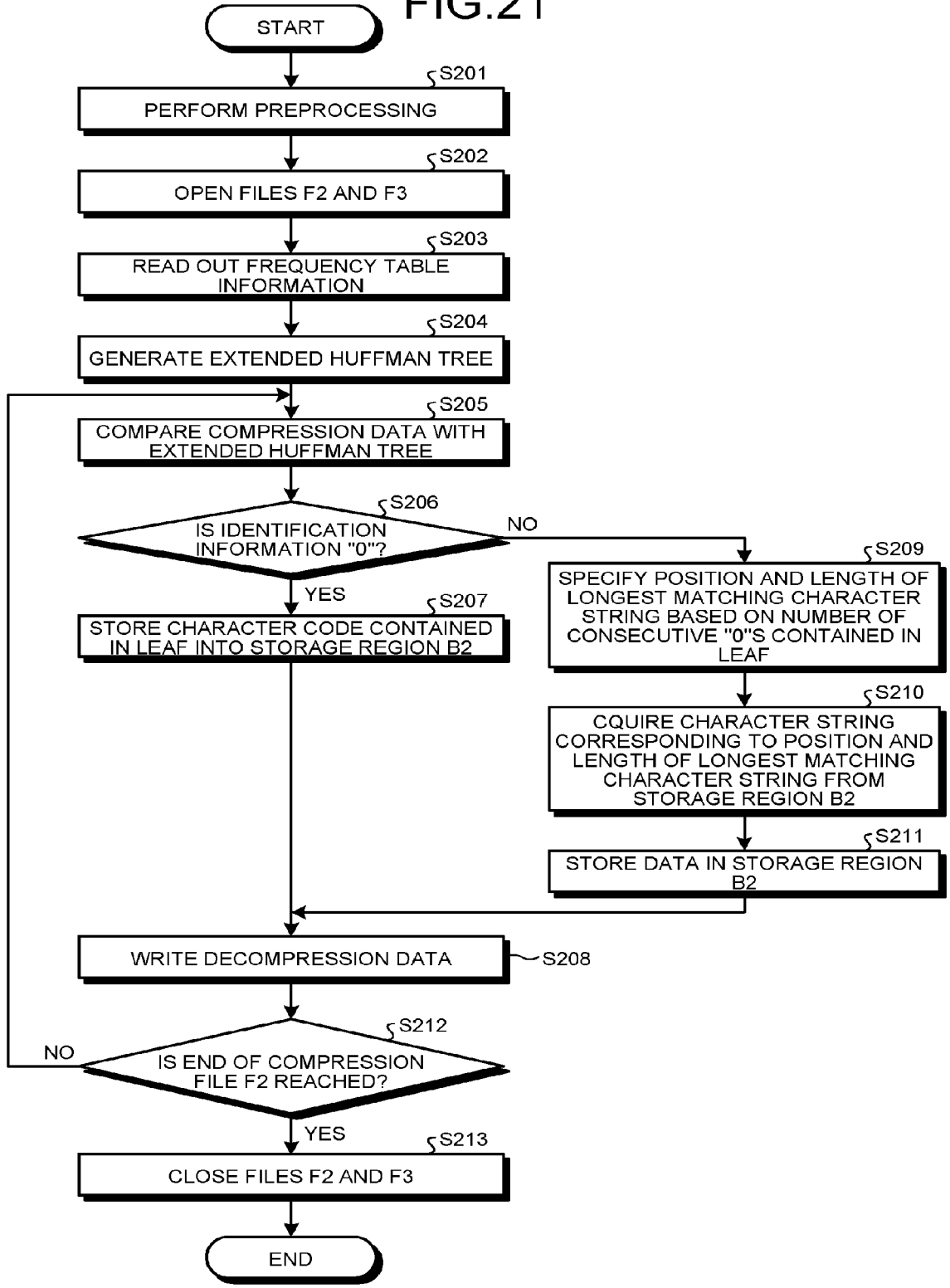
FIG. 21 is a flowchart illustrating a processing procedure of the decompressing unit according to the first embodiment.

FIG. 21 is a flowchart illustrating a processing procedure of the decompressing unit according to the first embodiment. As illustrated in FIG. 21, the decompressing unit 200*b* performs preprocessing (Step S201). In the preprocessing at Step S201, the decompressing unit 200*b* allocates the storage regions B1, B2, and B3 in the storage unit 200*c*.

The decompressing unit 200*b* opens the files F2 and F3 (Step S202), and reads out the frequency table 40 from the header of the compression file F2 (Step S203). The decompressing unit 200*b* generates the extended Huffman tree 30 (Step S204).

The decompressing unit 200*b* compares the compression data with the extended Huffman tree 30 (Step S205), and determines whether the identification information in a leaf of the extended Huffman tree 30 is "0" (Step S206).

If so (Yes at Step S206), the decompressing unit 200*b* stores the character code (data) contained in the leaf in the storage region B2 (Step S207), and writes the decompression data (Step S208).

If the identification information is "1" (No at Step S206), the decompressing unit 200*b* specifies the position and the length of the longest matching character string based on the number of consecutive 0s contained in the leaf (Step S209). The decompressing unit 200*b* acquires a character string corresponding to the position and the length of the longest matching character string from the storage region B2 (Step S210).

The decompressing unit 200*b* stores the data in the storage region B2 (Step S211), and performs the processing at Step S208. The decompressing unit 200*b* determines whether the end of the compression file F2 is reached (Step S212).

If not (No at Step S212), the decompressing unit 200*b* performs the processing at Step S205. If so (Yes at Step S212), the decompressing unit 200*b* closes the files F2 and F3 (Step S213).

Figure 22:
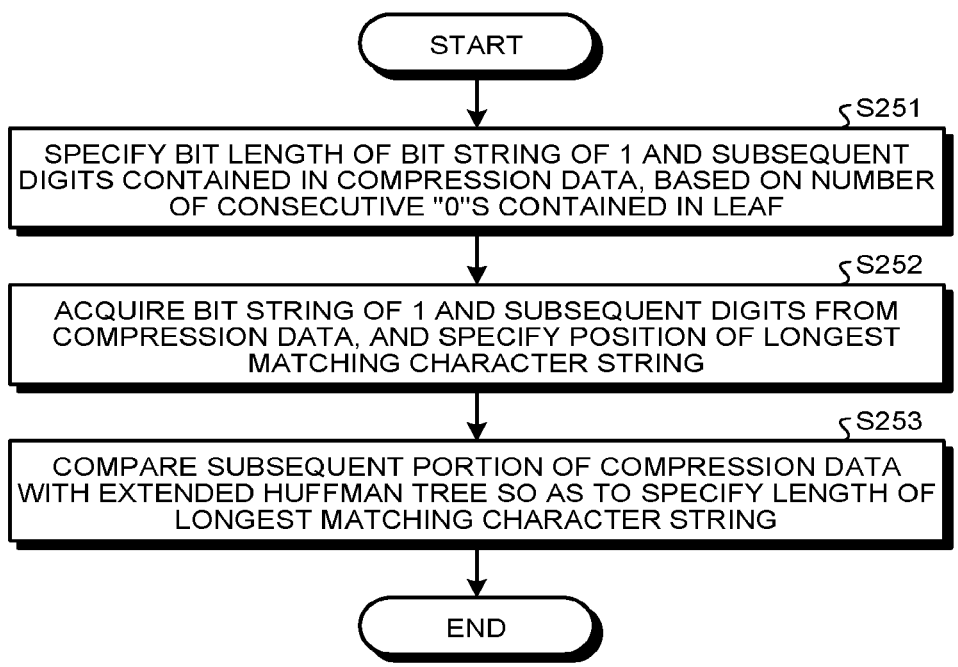
FIG. 22 is a flowchart illustrating a processing procedure for specifying the position and the length of the longest matching character string based on the number of consecutive 0s contained in a leaf.

The following describes the processing of specifying the position and the length of the longest matching character string based on the number of consecutive 0s contained in the leaf indicated at Step S209 in FIG. 21. FIG. 22 is a flowchart illustrating the processing procedure for specifying the position and the length of the longest matching character string based on the number of consecutive 0s contained in the leaf.

As illustrated in FIG. 22, the decompressing unit 200*b* specifies the bit length of the bit string of 1 and subsequent digits contained in the compression data based on the number of consecutive 0s contained in the leaf (Step S251). The decompressing unit 200*b* acquires the bit string of 1 and subsequent digits from the compression data, and specifies the position of the longest matching character string (Step S252).

The decompressing unit 200*b* compares the subsequent portion of the compression data with the extended Huffman tree 30 so as to specify the length of the longest matching character string (Step S253).

The following describes an effect of the information processing device 200*a* according to the present embodiment. At a preliminary stage, the compressing unit 200 of the information processing device 200 performs the longest matching search of the file F1 as a compression target, and specifies the appearance frequencies of the data and the appearance frequencies of the position of the longest matching character strings having a predetermined length or larger. Then, at a compression stage, the compressing unit 200a performs the longest matching character string search of the file F1 as a compression target. If the longest matching character string has a length smaller than the predetermined length, the compressing unit 200a encodes the longest matching character string based on the appearance frequency information, and generates the compression data. If the longest matching character string has a length equal to or larger than the predetermined length, the compressing unit 200a encodes the position of the longest matching character string based on the appearance frequency information, and generates the compression data of the longest matching character string. Accordingly, the identification information is not appended to the compression data, so that the compression rate is prevented from decreasing.

The information processing device 200 according to the first embodiment performs the compression using the extended Huffman tree 30 in which the appearance frequencies of the data and the appearance frequencies of the numbers of consecutive 0s are put together and also the identification information is added to the leaves, and uses the extended Huffman tree 30 to perform the decompression. When performing the decompression processing, the information processing device 200 only needs to follow the extended Huffman tree 30 and refer to the identification information in a leaf of the extended Huffman tree 30 so as to determine whether the compression data has been compressed based on the number of consecutive 0s. Therefore, the decompression can be performed without adding the identification information to the compression data during the compression processing.

At the preliminary stage, the decompressing unit 200 of the information processing device 200b performs the longest matching search of the file F1 as a compression target, and obtains the appearance frequencies of the data and the appearance frequencies of the positions of the longest matching character strings having the predetermined length or larger. Then, at a decompression stage, the compression file F2 is compared with the appearance frequency information so as to decompress the compression file F2. Hence, the compression file F2 can be appropriately decompressed without having the identification information added thereto.

Second Embodiment

The following describes compression processing by an information processing device according to a second embodiment. First, the information processing device refers to the file F1 as a compression target, and tallies the appearance frequencies of the data. In the same manner as in the first embodiment, the information processing device searches the file F1 for the longest matching character strings by performing the same processing as that of the longest matching character string search unit 106 illustrated in FIG. 2, and specifies the position of each of the longest matching character strings. When the leading bit of a 16-bit binary number representing the position is 0, the information processing device converts the position into the number of consecutive 0s, and tallies the appearance frequency of the number of consecutive 0s. The processing of converting the position into the number of consecutive 0s is the same as that of the first embodiment.

In contrast, when the leading bit of the 16-bit binary number representing the position is 1, the information processing device converts the position into the number of consecutive 1s, and tallies the appearance frequency of the number of consecutive 1s.

The following describes an example of the processing of converting the position into the number of consecutive 1s. The information processing device converts the position into a 16-bit binary number, and obtains the number of consecutive 1s by counting the number of 1s continuing from the leading bit. For example, a position "$64682_{(10)}$" is expressed as "1111110010101010" in 16-bit binary number. Accordingly, the number of consecutive 1s corresponding to the position "64682" is "6".

The information processing device generates the extended Huffman tree 30 based on the appearance frequencies of the data, the appearance frequencies of the numbers of consecutive 0s, and the appearance frequencies of the numbers of consecutive 1s. FIG. 23 is a diagram (2) illustrating another example of the extended Huffman tree. This extended Huffman tree 50 differs from the Huffman tree 10 in the leaf structures and in that the number of leaves is 288, which is larger by 32 than that of the Huffman tree 10.

The extended Huffman tree 50 illustrated in FIG. 23 includes a root node 51 at the highest level, nodes 52-1, . . . that are connected by branches, and leaves 50-1 to 50-288 at the lowest levels. The data structure of each of the nodes is illustrated in 50a. The data structure basically stores therein three kinds of pointers, that is, a pointer to a higher-order node, and pointers to right and left lower-order nodes. If neither branches nor nodes are present at the lower level, pieces of data of leaves are stored. The data structure of each of the leaves is illustrated in 50b. A leaf identifier, preliminary information, identification information, and information corresponding to the identification information are stored in each of the leaves. For example, when the identification information is "0", the information corresponding to the identification information is either the character information or the length information about the longest matching character string. When the identification information is "10", the information corresponding to the identification information is the "number of consecutive 0s". When the identification information is "11", the information corresponding to the identification information is the "number of consecutive 1s". The following compression processing is performed after the extended Huffman tree illustrated in FIG. 23 is generated.

Figure 24:
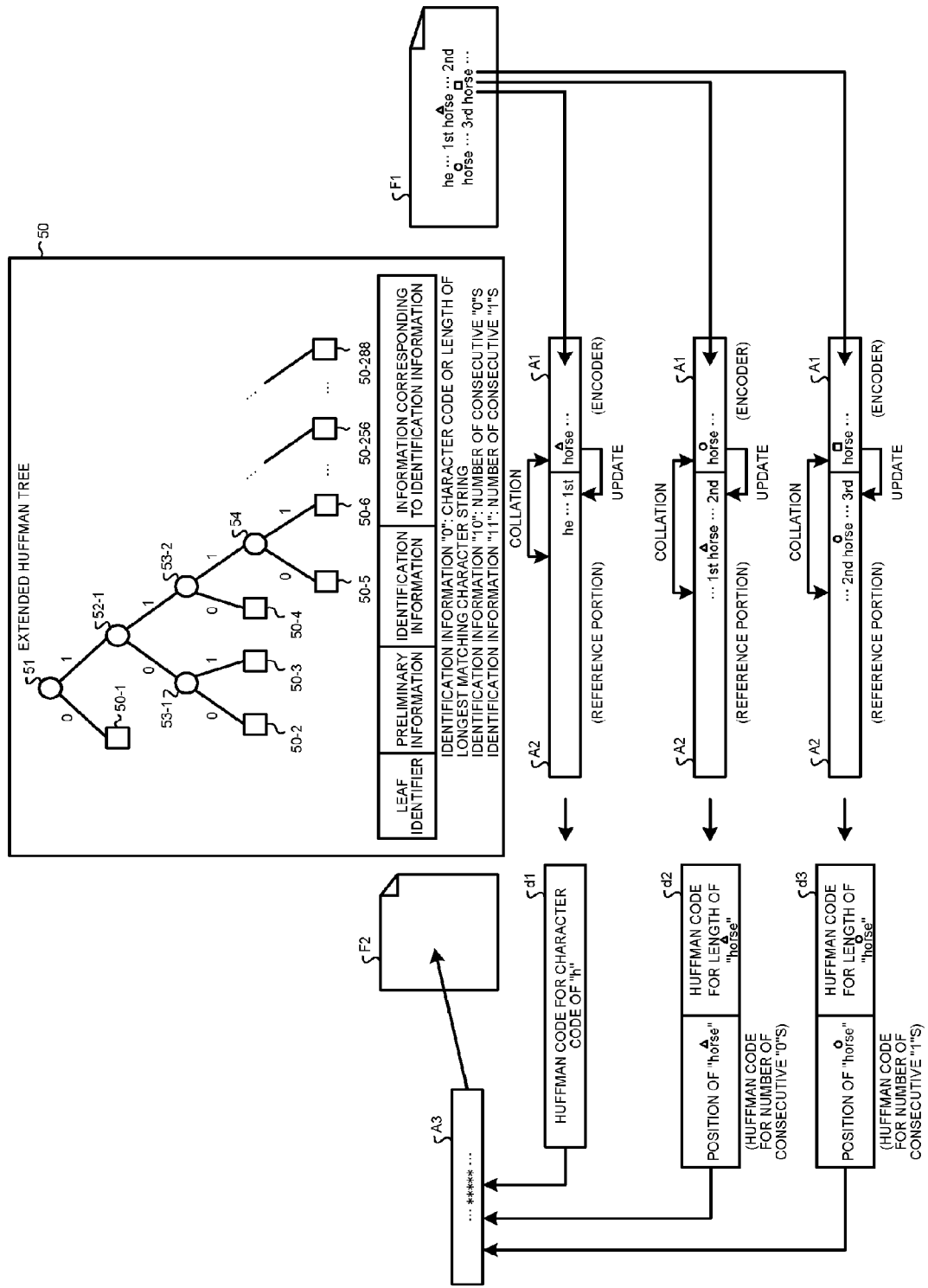
FIG. 24 is a diagram for explaining compression processing according to a second embodiment.

FIG. 24 is a diagram for explaining the compression processing according to the second embodiment. The information processing device allocates the storage regions A1, A2, and A3 in a storage unit. The storage region A1 is referred to as an encoder, for example. The file F1 contains, for example, data "he . . . 1st horse . . . 2nd horse . . . 3rd horse . . . ".

The information processing device reads the data into the storage region A1, and generates compression data. The information processing device copies the data generated by the compression data generation processing from the storage region A1 to the storage region A2. The storage region A2 is referred to as a reference portion, for example. The compression data is generated according to the result of collation processing between the data read into the storage region A1 and the data in the storage region A2. The information processing device sequentially stores the compression data in the storage region A3, and generates the compression file F2 based on the compression data stored in the storage region A3.

An example of the processing will be described in which "horse . . . " is stored in the storage region A1, and "he . . . 1st" is stored in the storage region A2, in FIG. 24. The information processing device compares the data in the storage region A1 with the data in the storage region A2 so as to search for the longest matching character string. For example, if "h" corresponds to the longest characters or data that matches with the data as a processing target in the storage region A2, the information processing device specifies "h" as a 1-byte character or data.

When the longest matching character string has a length of less than 3 bytes, such as in the case of "h", the information processing device performs the following processing. As illustrated in FIG. 24, the information processing device compares the 1-byte character "h" with the extended Huffman tree 50 so as to specify a Huffman code for the character "h" or the data and generate the compression data d1, and stores the compression data d1 in the storage region A3. The compression data d1 contains no identifier.

An example of the processing will be described in which "horse . . . " is stored in the storage region A1, and " . . . 1st horse . . . 2nd" is stored in the storage region A2, in FIG. 24. The information processing device compares the data in the storage region A1 with the data in the storage region A2 so as to search for the longest matching character string. For example, if "horse" corresponds to the longest data that matches with the data as a processing target in the storage region A2, the information processing device specifies "horse" as the longest matching character string.

When the longest matching character string has a length of 3 bytes or more, such as in the case of "horse", and also the leading bit of the position of the longest matching character string is "0", the information processing device performs the following processing. As illustrated in FIG. 24, the information processing device specifies the position of the longest matching character string in the storage region A2 and the data length of the longest matching character string. The information processing device compares the number of consecutive 0s corresponding to the position of the longest matching character string with the extended Huffman tree 50 so as to encode the number of consecutive 0s into a Huffman code. The information processing device also compares the length of the longest matching character string with the extended Huffman tree 50 so as to encode the length into a Huffman code. The information processing device combines the Huffman code for the number of consecutive 0s with the Huffman code for the length to generate the compression data d2, and stores the compression data d2 in the storage region A3. The compression data d2 contains no identifier.

An example of the processing will be described in which "horse . . . " is stored in the storage region A1, and " . . . 2nd horse . . . 3rd" is stored in the storage region A2, in FIG. 24. The information processing device compares the data in the storage region A1 with the data in the storage region A2 so as to search for the longest matching character string. For example, if "horse" corresponds to the longest data that matches with the data as a processing target in the storage region A2, the information processing device specifies "horse" as the longest matching character string.

When the longest matching character string has a length of 3 bytes or more, such as in the case of "horse", and also the leading bit of the position of the longest matching character string is "1", the information processing device performs the following processing. As illustrated in FIG. 24, the information processing device specifies the position of the longest matching character string in the storage region A2 and the data length of the longest matching character string. The information processing device compares the number of consecutive 1s corresponding to the position of the longest matching character string with the extended Huffman tree 50 so as to encode the number of consecutive 1s into a Huffman code. The information processing device also compares the length of the longest matching character string with the extended Huffman tree 50 so as to encode the length into a Huffman code. The information processing device combines the Huffman code for the number of consecutive 1s with the Huffman code for the length to generate the compression data d3, and stores the compression data d3 in the storage region A3. The compression data d3 contains no identifier.

Figure 25:
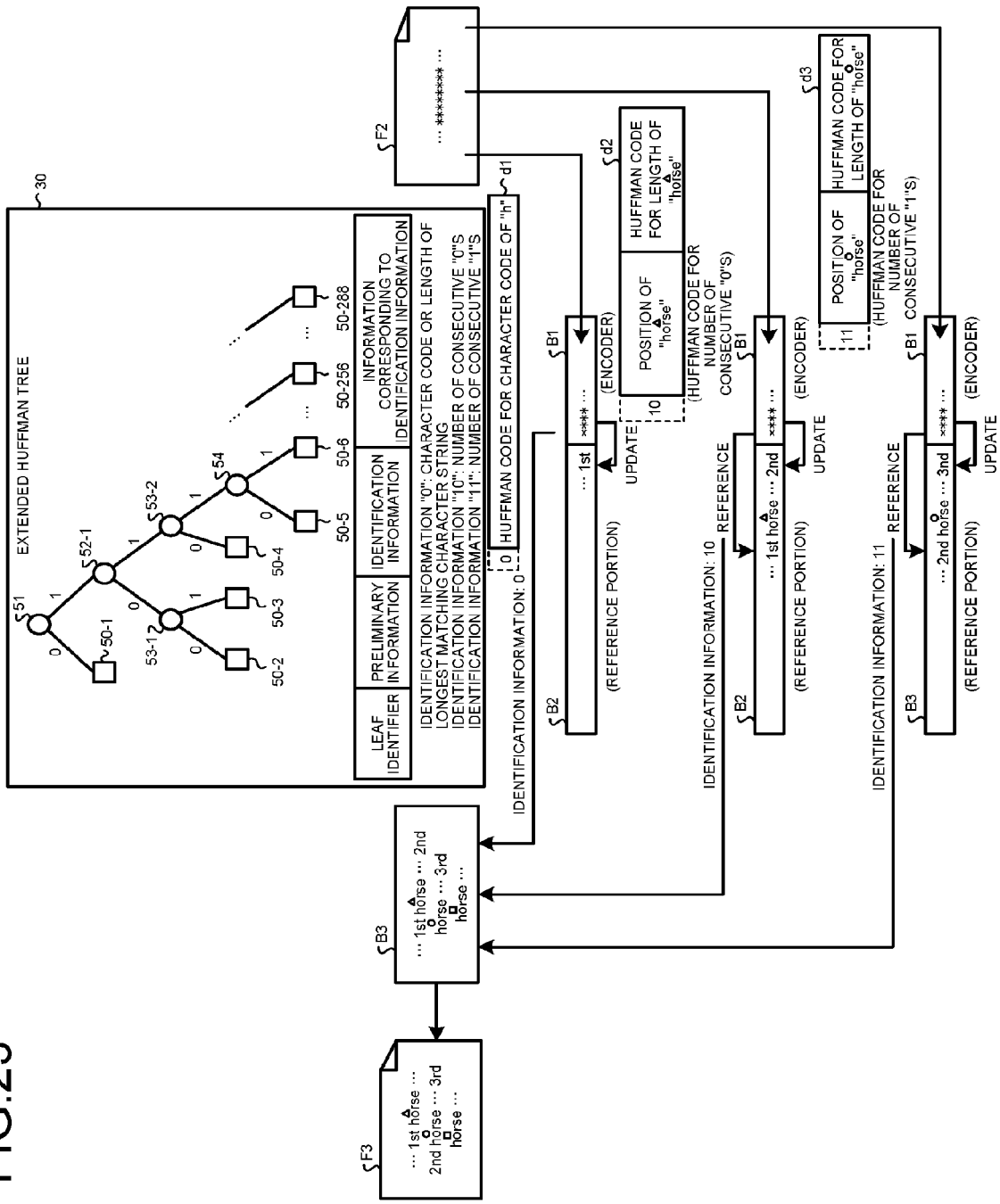
FIG. 25 is a diagram for explaining decompression processing according to the second embodiment.

FIG. 25 is a diagram for explaining decompression processing according to the second embodiment. The information processing device first allocates the storage regions B1, B2, and B3 in the storage unit. The information processing device loads the compression data in the compression file F2 into the storage region B1. The decompressing unit 300b compares the compression data with the extended Huffman tree 50 so as to specify a leaf, and determines whether identification information contained in the specified leaf is "0", "10", or "11".

When the identification information is "0", the information processing device specifies the data contained in the specified leaf as decompression data corresponding to the compression data. For example, when the identification information is "0" and the leaf contains "h", the decompression data corresponding to the compression data is "h". The information processing device stores the decompression data "h" in both the storage region B2 and the storage region B3.

When the identification information is "10", the information processing device specifies the position of the longest matching character string based on the number of consecutive 0s contained in the specified leaf. After specifying the position of the longest matching character string, the information processing device compares the subsequent portion of the compression data with the extended Huffman tree 50 so as to specify a leaf, and specifies the length of the longest matching character string contained in the specified leaf. The information processing device refers to the storage region B2, and acquires the data "horse" corresponding to the position and the length of the longest matching character string from the storage region B2. The acquired data "horse" is the decompression data corresponding to the compression data. The information processing device stores the decompression data "horse" in both the storage region B2 and the storage region B3.

When the identification information is "11", the information processing device specifies the position of the longest matching character string based on the number of consecutive 1s contained in the specified leaf. After specifying the position of the longest matching character string, the information processing device compares the subsequent portion of the compression data with the extended Huffman tree 50 so as to specify a leaf, and specifies the length of the longest matching character string contained in the specified leaf. The information processing device refers to the storage region B2, and acquires the data "horse" corresponding to the position and the length of the longest matching character string from the storage region B2. The acquired data "horse" is the decompression data corresponding to the compression data. The information processing device stores the decompression data "horse" in both the storage region B2 and the storage region B3.

Figure 26:
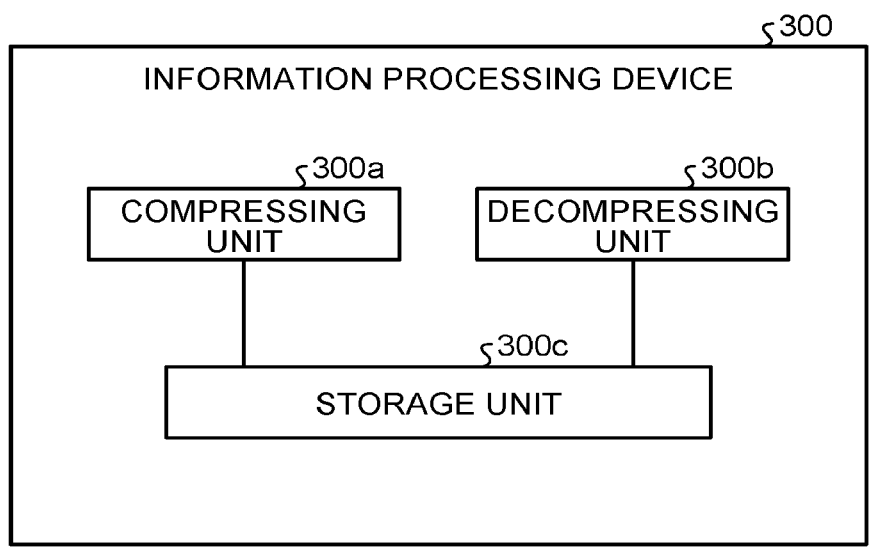
FIG. 26 is a diagram illustrating the configuration of an information processing device according to the second embodiment.

FIG. 26 is a diagram illustrating the configuration of the information processing device according to the second embodiment. As illustrated in FIG. 26, this information processing device 300 includes a compressing unit 300a, the decompressing unit 300b, and a storage unit 300c. The compressing unit 300a is a processor that performs the compression processing illustrated in FIG. 24. The decompressing unit 300b is a processor that performs the decompression processing illustrated in FIG. 25. The storage unit 300c mediates transmission of, for example, the file F1 as a compression target, the compression file F2 obtained by the compression processing, and the file F3 obtained by decompressing the file F2.

Figure 27:
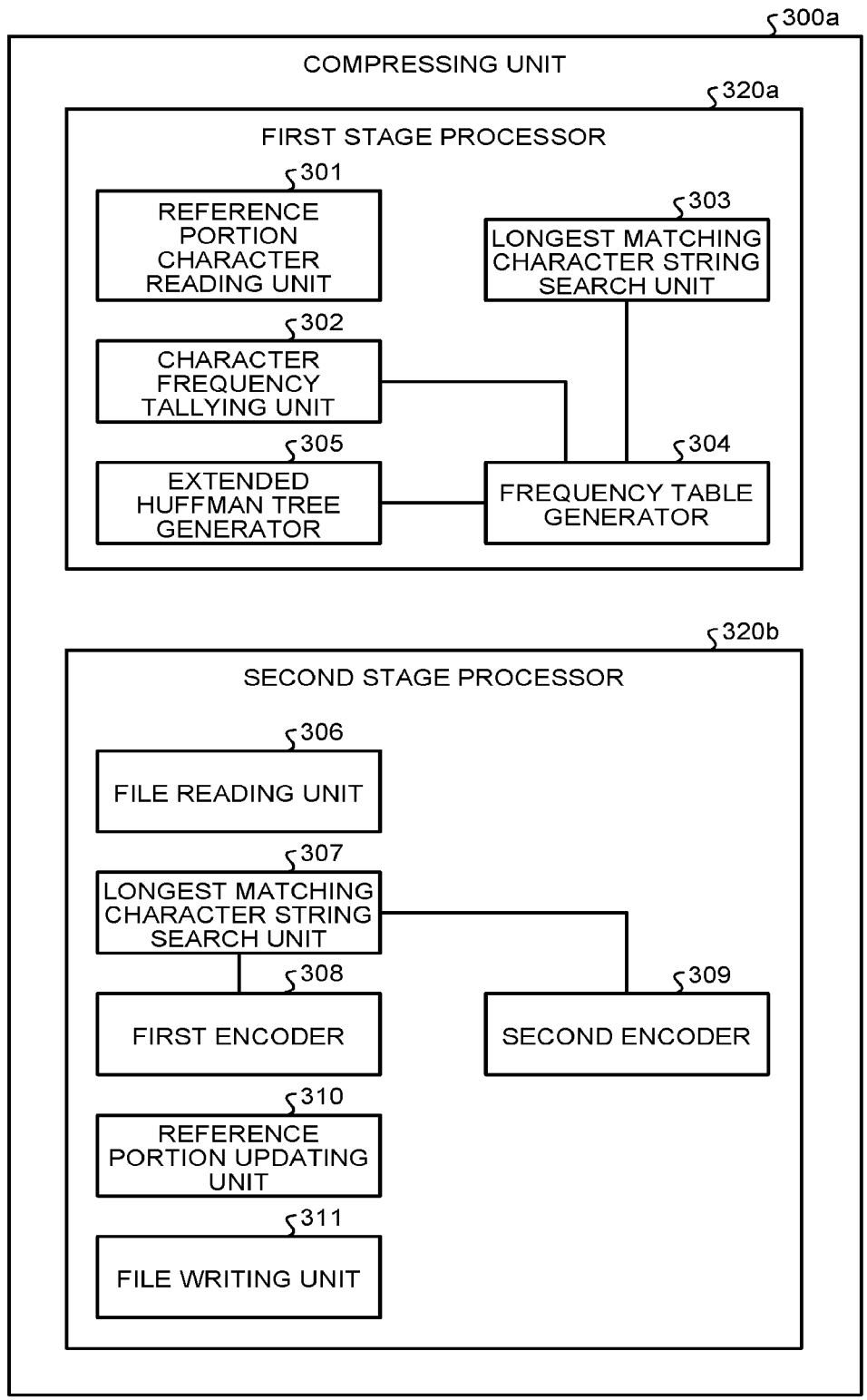
FIG. 27 is a functional block diagram illustrating the configuration of a compressing unit according to the second embodiment.

FIG. 27 is a functional block diagram illustrating the configuration of the compressing unit according to the second embodiment. As illustrated in FIG. 27, the compressing unit 300a includes a first stage processor 320a and a second stage processor 320b. The first stage processor 320a includes a reference portion character reading unit 301, a character frequency tallying unit 302, a longest matching character string search unit 303, a frequency table generator 304, and an extended Huffman tree generator 305. The second stage processor 320b includes a file reading unit 306, a longest matching character string search unit 307, a first encoder 308, a second encoder 309, a reference portion updating unit 310, and a file writing unit 311. Descriptions of the reference portion character reading unit 301 and the character frequency tallying unit 302 among the above-listed functional blocks are the same as those of the reference portion character reading unit 201 and the character frequency tallying unit 202 mentioned in the first embodiment.

The longest matching character string search unit 303 is a processor that compares the data stored in the storage region A2 as the reference portion with the data stored in the storage region A1 as the encoder so as to search for the longest matching character string. The processing of searching for the longest matching character string is the same as that performed by the longest matching character string search unit 106 illustrated in FIG. 5.

When the leading bit of the position of the longest matching character string is "0", the longest matching character string search unit 303 converts the position into the number of consecutive 0s. Specifically, the longest matching character string search unit 303 converts the position into a 16-bit binary number, and calculates the number of consecutive 0s by counting the number of 0s continuing from the leading bit. For example, a position "$26_{(10)}$" is expressed as "0000000000011010" in 16-bit binary number. Accordingly, the number of consecutive 0s corresponding to the position "26" is "11".

Each time the data in the storage region A1 is updated, the longest matching character string search unit 303 calculates the number of consecutive 0s for the position of the longest matching character string, and calculates the appearance frequencies of the respective numbers of consecutive 0s. The longest matching character string search unit 303 outputs the appearance frequency information about the respective numbers of consecutive 0s to the frequency table generator 304.

When the leading bit of the position of the longest matching character string is "1", the longest matching character string search unit 303 converts the position into the number of consecutive 1s. Specifically, the longest matching character string search unit 303 converts the position into a 16-bit binary number, and calculates the number of consecutive 1s by counting the number of 1s continuing from the leading bit. For example, a position "$64682_{(10)}$" is expressed as "1111110010101010" in 16-bit binary number. Accordingly, the number of consecutive 1s corresponding to the position "$64682_{(10)}$" is "6".

Each time the data in the storage region A1 is updated, the longest matching character string search unit 303 calculates the number of consecutive 1s for the position of the longest matching character string, and calculates the appearance frequencies of the respective numbers of consecutive 1s. The longest matching character string search unit 303 outputs the appearance frequency information about the respective numbers of consecutive 1s to the frequency table generator 304.

The frequency table generator 304 is a processor that generates an extended frequency table based on the appearance frequencies of the respective pieces of data, the appearance frequencies of the numbers of consecutive 0s, and the appearance frequencies of the numbers of consecutive 1s. The frequency table generator 304 outputs the extended frequency table information to the extended Huffman tree generator 305. FIG. 28 is a diagram (2) illustrating another example of the data structure of the extended frequency table. As illustrated in FIG. 28, this extended frequency table 60 associates the character codes (data)/lengths with the appearance frequencies thereof, and also associates the numbers of consecutive 0s with the appearance frequencies thereof and the number of consecutive 1s with the appearance frequencies thereof. The number of records associating the character codes (data)/lengths with the appearance frequencies thereof is 256. The number of records associating the numbers of consecutive 0s with the appearance frequencies thereof is 16. The number of records associating the numbers of consecutive 1s with the appearance frequencies thereof is 16. A number for a character code (data)/length corresponds to a number or a length corresponding to a predetermined character.

The extended Huffman tree generator 305 is a processor that generates the extended Huffman tree 50 based on the extended frequency table 60. The data structures of the extended Huffman tree corresponds to the extended Huffman tree 50 illustrated in FIG. 23.

The extended Huffman tree generator 305 generates 256 leaf structures in each of which a leaf identifier, preliminary information, the identification information "0", and a character code (data) or the length of the longest matching character string are associated with one another. The extended Huffman tree generator 305 generates 16 leaf structures in each of which a leaf identifier, preliminary information, identification information "10", and the number of consecutive 0s are associated with one another. The extended Huffman tree generator 305 generates 16 leaf structures in each of which a leaf identifier, preliminary information, identification information "11", and the number of consecutive 1s are associated with one another. The extended Huffman tree generator 305 compares the character codes (data), the numbers of consecutive 0s, or the numbers of consecutive 1s contained in the leaf structures with those in the frequency table 60 so as to specify the appearance frequencies of the respective leaf structures.

The extended Huffman tree generator 305 sorts the leaf structures in the descending order of the appearance frequencies of the character codes, the numbers of consecutive 0s, or the numbers of consecutive 1s, and forms "branches" of a binary tree according to the appearance frequencies to build up the binary tree branches toward the higher level so as to generate the Huffman tree.

As described with reference to FIG. 24, the second stage processor 320b is a processor that compresses the file F1.

Processing by the respective units included in the second stage processor 320*b* will be described.

The file reading unit 306 is a processor that reads out the data in the content portion in the file F1 into the storage region A1 corresponding to the encoder. The file reading unit 306 reads out new data from the file F1 and updates the data stored in the storage region A1 after the processing on the data stored in the storage region A1 is finished, the data in the storage region A1 is transferred to the storage region A2 as the reference portion, and the data in the storage region A3 storing therein the compression code is written into the compression file F2.

The longest matching character string search unit 307 is a processor that compares the data stored in the storage region A2 as the reference portion with the data stored in the storage region A1 so as to search for the longest matching character string. The processing of searching for the longest matching character string is the same as the processing illustrated in FIG. 24. The longest matching character string search unit 307 outputs the longest matching character string information to the first and second encoders 308 and 309.

The first encoder 308 performs processing when the amount of data in the longest matching character string is less than 3 bytes. When the amount of data in the longest matching character string is less than 3 bytes, the first encoder 308 compares each 1-byte character code or the binary expression of the data with the extended Huffman tree 50 so as to specify a Huffman code. The first encoder 308 stores the Huffman code in the storage region A3, and outputs the Huffman code to the file writing unit 311. The Huffman code itself serves as compression data.

FIG. 29 is a diagram (2) for explaining processing by the second encoder of the compressing unit. When the amount of data in the longest matching character string is 3 bytes or more and the leading bit of the position of the longest matching character string is "0", the second encoder 309 performs processing illustrated in the upper portion of FIG. 29. Assume that "horse . . . " is stored in the storage region A1, " . . . 1st horse . . . 2nd" is stored in the storage region A2, and "horse" is the longest matching character string, as illustrated in the upper portion of FIG. 29.

When the amount of data in the longest matching character string is 3 bytes or more, the second encoder 309 specifies a position of the longest matching character string from a leading character in the storage region A2 and the matching length of the longest matching character string. In the example illustrated in FIG. 29, the position of the longest matching character string is "X1", and the length of the longest matching character string is "Y1". When the position X1 is expressed as "0000000000011010", the leading bit is "0".

The second encoder 309 specifies the "number of consecutive 0s" and a "bit string of 1 and subsequent digits" obtained when the position "X1" of the longest matching character string is expressed in 16-bit binary number. The second encoder 309 compares the "number of consecutive 0s" with the extended Huffman tree 50 so as to obtain a Huffman code for the "number of consecutive 0s". The second encoder 309 also compares the length "Y1" of the longest matching character string with the extended Huffman tree 50 so as to obtain a Huffman code for the length "Y1" of the longest matching character string.

The second encoder 309 generates the compression data d2 by combining the Huffman code for the "number of consecutive 0s" for the position of the longest matching character string, the "bit string of 1 and subsequent digits" for the position of the longest matching character string, and the Huffman code for the "length" of the longest matching character string. The second encoder 309 stores the compression data d2 in the storage region A3, and outputs the compression data d2 to the file writing unit 311.

When the amount of data in the longest matching character string is 3 bytes or more and the leading bit of the position of the longest matching character string is "1", the second encoder 309 performs processing illustrated in the lower portion of FIG. 29. Assume that "horse . . . " is stored in the storage region A1, " . . . 2nd horse . . . 3rd" is stored in the storage region A2, and "horse" is the longest matching character string, as illustrated in the lower portion of FIG. 29.

When the amount of data in the longest matching character string is 3 bytes or more, the second encoder 309 specifies a position of the longest matching character string from a leading character in the storage region A2 and the matching length of the longest matching character string. In the example illustrated in FIG. 29, the position of the longest matching character string is "X2", and the length of the longest matching character string is "Y2". When the position X2 is expressed as "1111110010101010", the leading bit is "1".

The second encoder 309 specifies the "number of consecutive 1s" and a "bit string of 0 and subsequent digits" obtained when the position "X2" of the longest matching character string is expressed in 16-bit binary number. The second encoder 309 compares the "number of consecutive 1s" with the extended Huffman tree 50 so as to obtain a Huffman code for the "number of consecutive 1s". The second encoder 309 also compares the length "Y2" of the longest matching character string with the extended Huffman tree 50 so as to obtain a Huffman code for the length "Y2" of the longest matching character string.

The second encoder 309 generates the compression data d3 by combining the Huffman code for the "number of consecutive 1s" for the position of the longest matching character string, the "bit string of 0 and subsequent digits" for the position of the longest matching character string, and the Huffman code for the "length" of the longest matching character string. The second encoder 309 stores the compression data d3 in the storage region A3, and outputs the compression data d3 to the file writing unit 311.

Descriptions of the reference portion updating unit 310 and the file writing unit 311 are the same as the descriptions of the reference portion updating unit 210 and the file writing unit 211 mentioned in the first embodiment.

Figure 30:
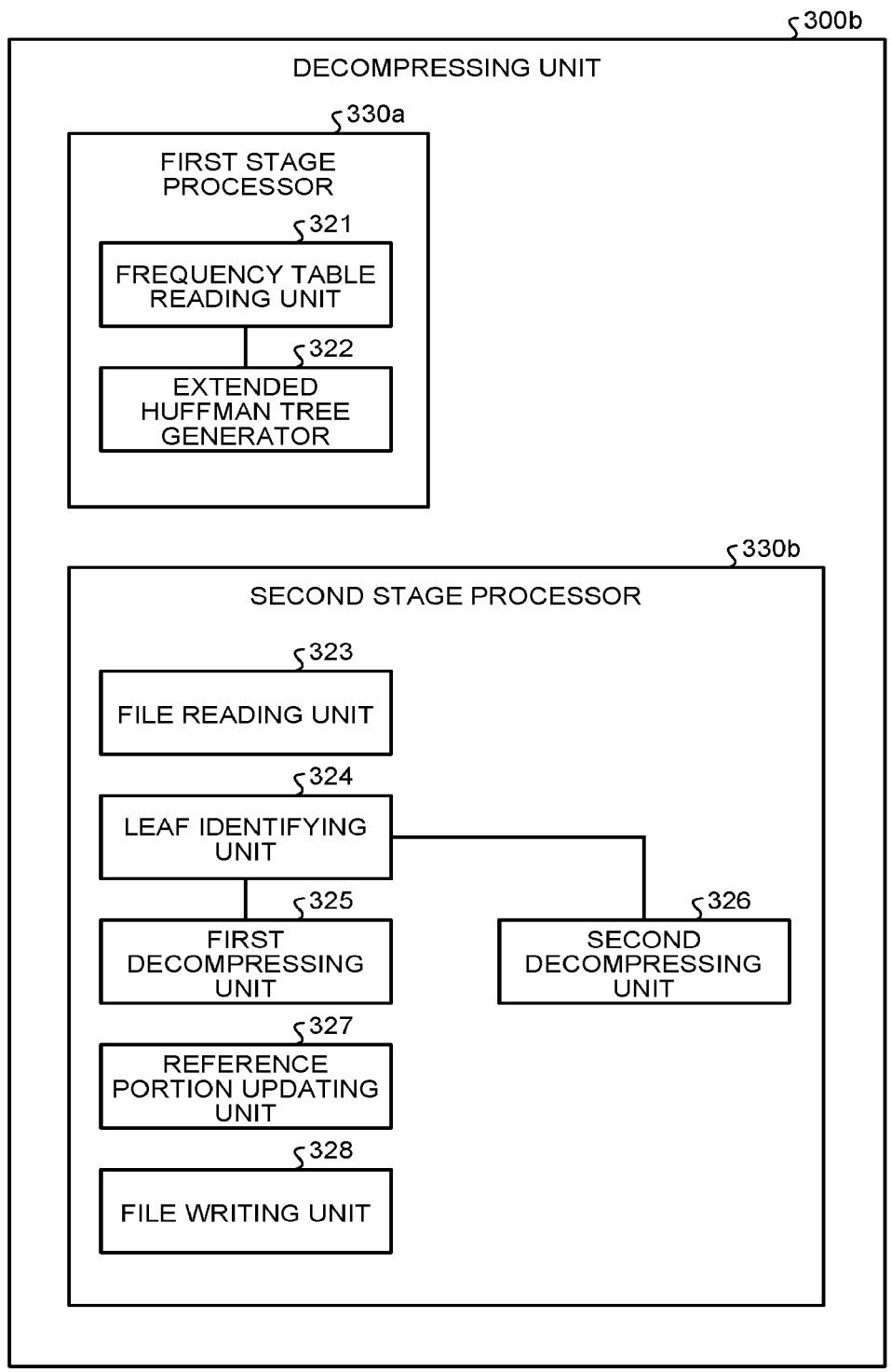
FIG. 30 is a functional block diagram illustrating the configuration of a decompressing unit according to the second embodiment.

FIG. 30 is a functional block diagram illustrating the configuration of the decompressing unit according to the second embodiment. As illustrated in FIG. 30, the decompressing unit 300*b* includes a first stage processor 330*a* and a second stage processor 330*b*. The first stage processor 330*a* includes a frequency table reading unit 321 and an extended Huffman tree generator 322.

The first stage processor 330*a* is a processor that generates the extended Huffman tree 50 based on the information in the extended frequency table 60 contained in the header information in the compression file F2. The units included in the first stage processor 330*a* will be described.

The frequency table reading unit 321 is a processor that reads out the information in the extended frequency table 60, and outputs the read-out information to the extended Huffman tree generator 322. For example, the extended frequency table information corresponds to the extended frequency table information generated by the frequency table generator 304 of FIG. 27.

The extended Huffman tree generator 322 is a processor that generates the extended Huffman tree 50 based on the extended frequency table 60. The processing of generating the extended Huffman tree 50 by the extended Huffman tree generator 322 is the same as the processing of generating the extended Huffman tree 50 by the extended Huffman tree generator 305 of FIG. 27.

As described with reference to FIG. 25, the second stage processor 330b is a processor that decompresses the compression file F2. Processing by respective units included in the second stage processor 330b will be described.

A file reading unit 323 is a processor that reads out the compression data in the compression file F2 into the storage region B1. When the processing on the compression data stored in the storage region B1 is finished, the file reading unit 323 reads out new data from the compression file F2, and updates the compression data stored in the storage region B1.

A leaf identifying unit 324 is a processor that compares the compression data stored in the storage region B1 with the extended Huffman tree 50 so as to specify a leaf by following the extended Huffman tree 50. The leaf identifying unit 324 outputs the specified leaf information to a first decompressing unit 325 and a second decompressing unit 326.

The first decompressing unit 325 performs processing when the identification information contained in the leaf is "0". When the identification information is "0", the leaf contains character code information, as described with reference to FIG. 23. The first decompressing unit 325 extracts the character code information contained in the leaf. The first decompressing unit 325 stores, as decompression data, the extracted character information in the storage region B2 as the reference portion and in the storage region B3, and outputs the character information to a file writing unit 328.

The second decompressing unit 326 performs processing when the identification information contained in the leaf is "10" or "11". When the identification information is "10", the leaf contains the "number of consecutive 0s", as described with reference to FIG. 23. When the identification information is "10", the second decompressing unit 226 performs the same decompression data generating processing as that performed by the second decompressing unit 326 of the first embodiment.

Figure 31:
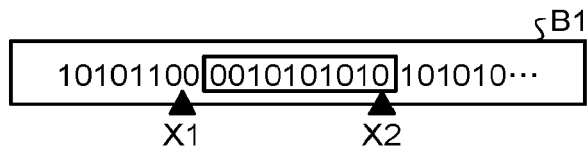
FIG. 31 is a diagram (2) for explaining processing by the second decompressing unit.

FIG. 31 is a diagram (2) for explaining the processing by the second decompressing unit. FIG. 31 assumes that the compression data contained in the storage region B1 has been compared with the extended Huffman tree 50, and a pointer has moved to a position X1 in the storage region B1. The position of the longest matching character string has been converted into a 16-bit binary number, so that, if the "number of consecutive 1s" is "6", the bit string of 1 and subsequent digits has a bit length of "10 bits". Accordingly, the second decompressing unit 326 restores the bit string "111111010101010" obtained by adding "111111" in front of a bit string "010101010" ranging from a position next to the position X1 to a position X2 advanced therefrom by 10 bits, as the position of the longest matching character string.

The second decompressing unit 326 compares bits after the position X2 with the extended Huffman tree 50 so as to specify a leaf of the extended Huffman tree 50, and specifies the length of the longest matching character string contained in the specified leaf. The second decompressing unit 326 performs the processing described above so as to specify the position and the length of the longest matching character string. The second decompressing unit 326 extracts a character string corresponding to the position and the length from the storage region B2, and sets the extracted character string as the decompression data. The second decompressing unit 326 stores the decompression data in the storage region B2 as the reference portion and in the storage region B3, and outputs the decompression data to a reference portion updating unit 327 and the file writing unit 328.

Descriptions of the reference portion updating unit 327 and the file writing unit 328 are the same as the descriptions of the reference portion updating unit 227 and the file writing unit 228 of the first embodiment.

The overall processing procedure of the compressing unit 300a according to the second embodiment is the same as that illustrated in FIG. 18. The following specifically describes a detailed procedure of processing for generating the frequency table 60 and processing for generating the extended Huffman tree 50.

Figure 32:
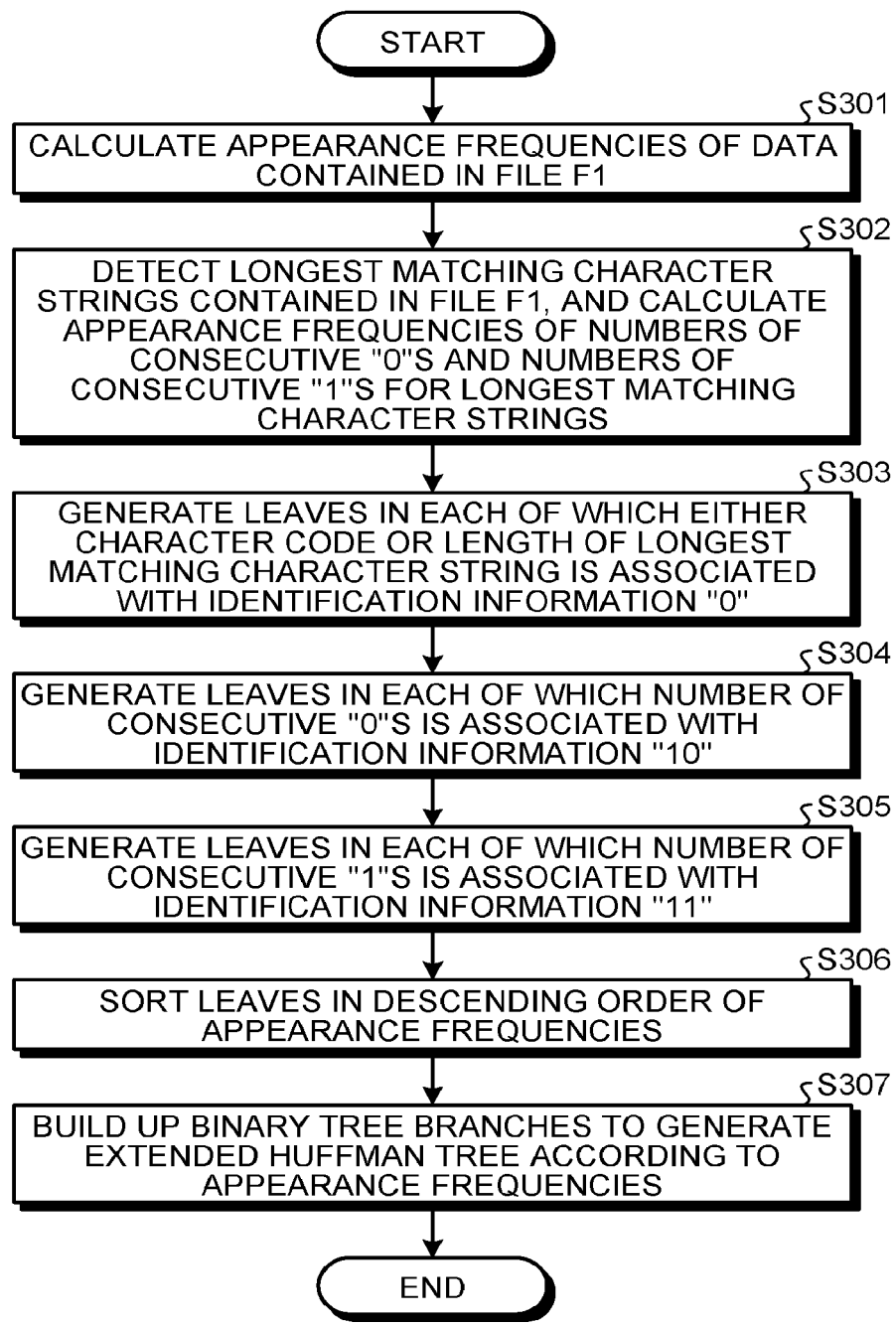
FIG. 32 is a flowchart (2) illustrating processing procedure for generating the frequency table and the extended Huffman tree.

FIG. 32 is a flowchart (2) illustrating the processing procedure for generating the frequency table and the extended Huffman tree. As illustrated in FIG. 32, the compressing unit 300a calculates the appearance frequencies of the data contained in the file F1 (Step S301). The compressing unit 300a detects the longest matching character strings contained in the file F1, and calculates the appearance frequencies of the numbers of consecutive 0s and the numbers of consecutive 1s for the longest matching character strings (Step S302).

The compressing unit 300a generates leaves in each of which either the character code or the length of the longest matching character string is associated with the identification information "0" (Step S303). The compressing unit 300a generates leaves in each of which the number of consecutive 0s is associated with the identification information "10" (Step S304). The compressing unit 300a generates leaves in each of which the number of consecutive 1s is associated with the identification information "11" (Step S305).

The compressing unit 300a sorts the leaves in the descending order of the appearance frequencies (Step S306). The compressing unit 300a builds up the binary tree branches to generate the extended Huffman tree 50 based on the appearance frequencies (Step S307).

The following specifically describes a processing procedure for the compressing unit 300a according to the second embodiment to generate the compression data.

Figure 33:
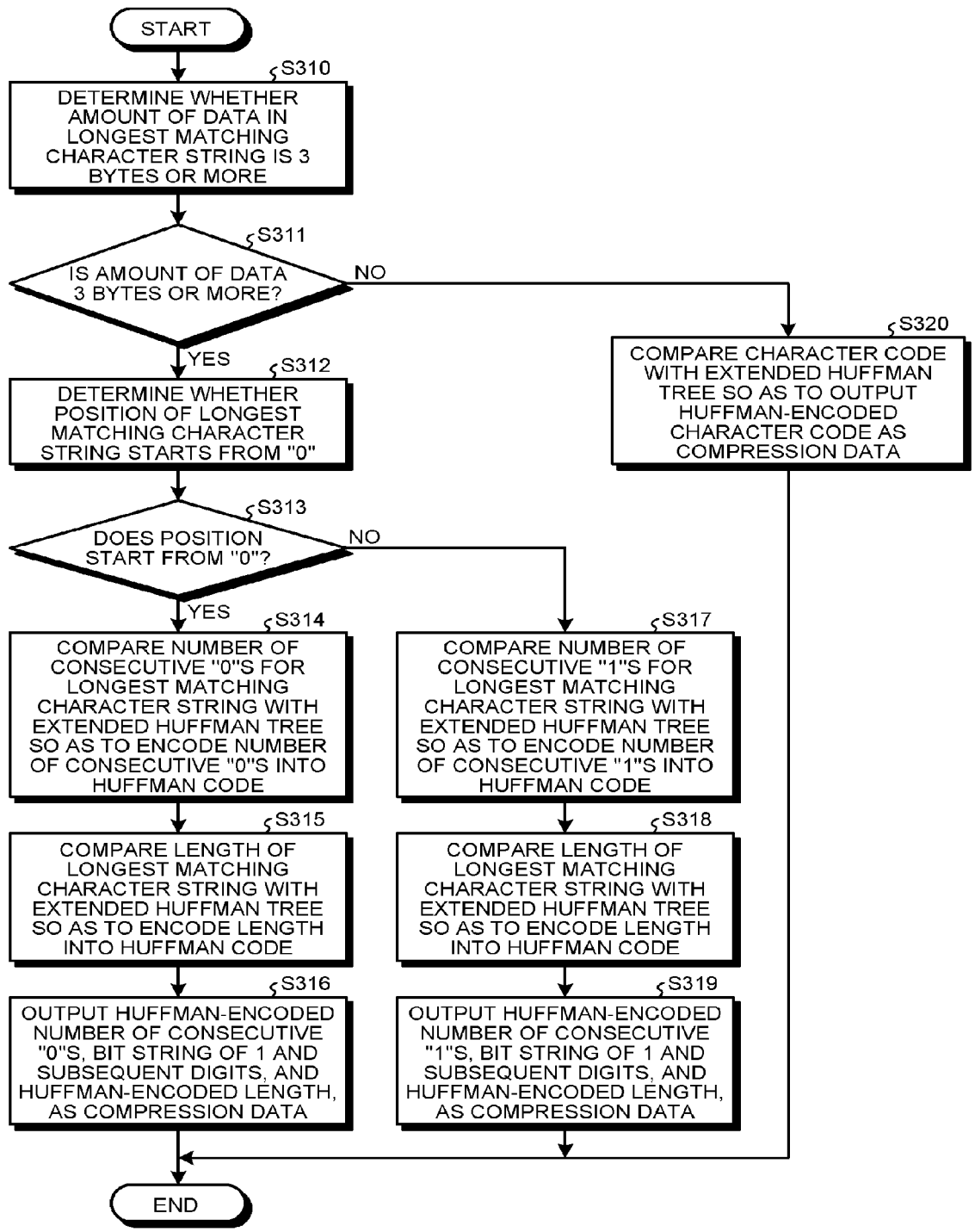
FIG. 33 is a flowchart (2) illustrating processing procedure for generating the compression data.

FIG. 33 is a flowchart (2) illustrating the processing procedure for generating the compression data. As illustrated in FIG. 33, the compressing unit 300a determines whether the amount of data in the longest matching character string is 3 bytes or more (Step S310).

If so (Yes at Step S311), the compressing unit 300a determines whether the position of the longest matching character string starts from "0" (Step S312). If so (Yes at Step S313), the compressing unit 300a compares the number of consecutive 0s for the longest matching character string with the extended Huffman tree 50 so as to encode the number of consecutive 0s into a Huffman code (Step S314).

The compressing unit 300a compares the length of the longest matching character string with the extended Huffman tree 50 so as to encode the length into a Huffman code (Step S315). The compressing unit 300a outputs the Huffman-encoded number of consecutive 0s, the bit string of 1 and subsequent digits, and the Huffman-encoded length, as the compression data (Step S316).

If the position of the longest matching character string does not start from "0" (No at Step S313), the compressing unit 300a compares the number of consecutive 1s for the longest matching character string with the extended Huffman tree 50 so as to encode the number of consecutive is into a Huffman code (Step S317).

The compressing unit 300a compares the length of the longest matching character string with the extended Huffman tree 50 so as to encode the length into a Huffman code (Step S318). The compressing unit 300a outputs the Huffman-encoded number of consecutive 1s, the bit string of 0 and subsequent digits, and the Huffman-encoded length, as the compression data (Step S319).

If the amount of data in the longest matching character string is less than 3 bytes (No at Step S311), the compressing unit 300a compares the character code with the extended Huffman tree 50 so as to encode the character code into a Huffman code, and outputs the Huffman code as the compression data (Step S320).

Figure 34:
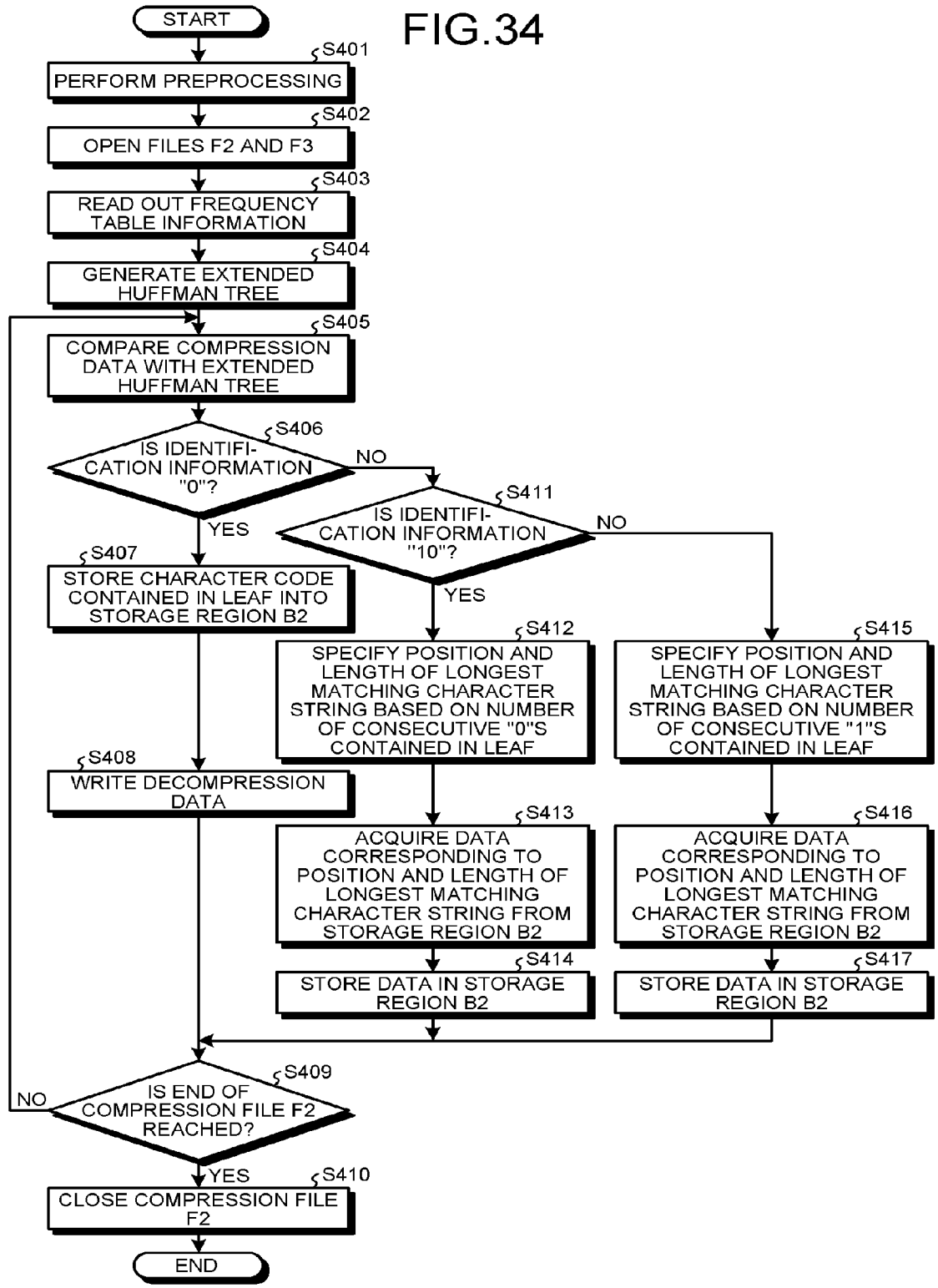
FIG. 34 is a flowchart illustrating a processing procedure of the decompressing unit according to the second embodiment.

FIG. 34 is a flowchart illustrating a processing procedure of the decompressing unit according to the second embodiment. As illustrated in FIG. 34, the decompressing unit 300b performs preprocessing (Step S401). In the preprocessing at Step S401, the decompressing unit 300b allocates the storage regions B1, B2, and B3 in the storage unit 300c.

The decompressing unit 300b opens the files F2 and F3 (Step S402), and reads out the frequency table 60 from the header of the compression file F2 (Step S403). The decompressing unit 300b generates the extended Huffman tree 50 (Step S404).

The decompressing unit 300b compares the compression data with the extended Huffman tree 50 (Step S405), and determines whether the identification information in a leaf of the extended Huffman tree 50 is "0" (Step S406).

If so (Yes at Step S406), the decompressing unit 300b stores the character code contained in the leaf in the storage region B2 (Step S407), and writes the decompression data (Step S408).

If the end of the compression file F2 is not reached (No at Step S409), the decompressing unit 300b performs the processing at Step S405. If the end of the compression file F2 is reached (Yes at Step S409), the decompressing unit 300b closes the files F2 and F3.

If the identification information is not "0" (No at Step S406), the decompressing unit 300b determines whether the identification information is "10" (Step S411). If so (Yes at Step S411), the decompressing unit 300b specifies the position and the length of the longest matching character string based on the number of consecutive 0s contained in the leaf (Step S412). The decompressing unit 300b acquires the data corresponding to the position and the length of the longest matching character string from the storage region B2 (Step S413). The decompressing unit 300b stores the data in the storage region B2 (Step S414), and performs the processing at Step S409.

If the identification information is "11" (No at Step S411), the decompressing unit 300b specifies the position and the length of the longest matching character string based on the number of consecutive 1s contained in the leaf (Step S415). The decompressing unit 300b acquires a character string corresponding to the position and the length of the longest matching character string from the storage region B2 (Step S416). The decompressing unit 300b stores the data in the storage region B2 (Step S417), and performs the processing at Step S409.

The following describes an effect of the information processing device 300 according to the second embodiment. The compressing unit 300a of the information processing device 300 performs the same processing as that of the longest matching character string search unit 106 to search the file F1 for the longest matching character strings, and specifies the position of each of the respective longest matching character strings. When the leading bit of a 16-bit binary number representing the position is 0, the information processing device converts the position into the number of consecutive 0s, and tallies the appearance frequency of the number of consecutive 0s. When the leading bit is 1, the compressing unit 300a converts the position into the number of consecutive 1s, and tallies the appearance frequency of the number of consecutive 1s. The compressing unit 300a generates an extended Huffman tree in which the appearance frequencies of the data, the appearance frequencies of the numbers of consecutive 0s, and the appearance frequencies of the numbers of consecutive 1s are put together, and uses the extended Huffman tree to perform the compression processing. The compressing unit 300a uses one kind of the extended Huffman tree, and each leaf of the extended Huffman tree contains the identification information. As a result, the compression data can be decompressed without having the identification information added thereto, so that the compression rate is prevented from decreasing.

Figure 35:
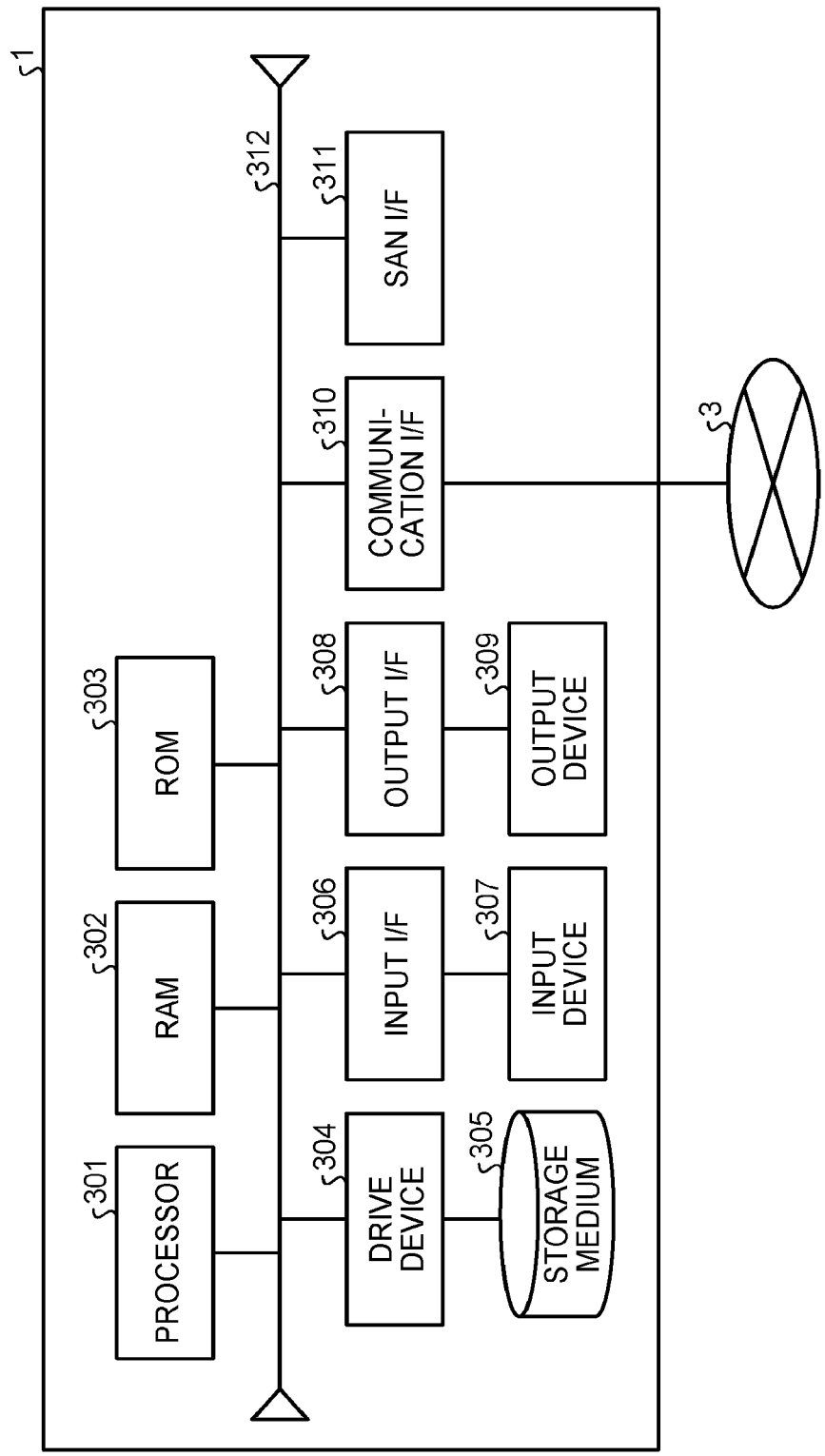
FIG. 35 is a diagram illustrating an example of the hardware configuration of a computer.

The following describes hardware and software used in the embodiments of the present invention. FIG. 35 illustrates an example of the hardware configuration of a computer 1. The computer 1 includes, for example, a processor 301, a random access memory (RAM) 302, a read-only memory (ROM) 303, a drive device 304, a storage medium 305, an input interface (I/F) 306, an input device 307, an output interface (I/F) 308, an output device 309, a communication interface (I/F) 310, a storage area network (SAN) interface (I/F) 311, and a bus 312. The respective pieces of hardware are connected through the bus 312.

The RAM 302 is a readable and writable memory device, for which, for example, a semiconductor memory, such as a static RAM (SRAM) or a dynamic RAM (DRAM), or a flash memory, though different from a RAM, is used. Examples of the ROM 303 include, but are not limited to, a programmable ROM (PROM). The drive device 304 is a device that executes at least one of reading and writing of information recorded on the storage medium 305. The storage medium 305 stores therein information written by the drive device 304. The storage medium 305 is, for example, a storage medium, such as a hard disk, a flash memory such as a solid state drive (SSD), a compact disc (CD), a digital versatile disc (DVD), or a Blu-ray Disc. For example, the computer 1 is provided with the drive device 304 and the storage medium 305 for each of a plurality of types of storage media.

The input interface 306 is a circuit that is connected to the input device 307 and transmits input signals received from the input device 307 to the processor 301. The output interface 308 is a circuit that is connected to the output device 309 and causes the output device 309 to perform output according to an instruction from the processor 301. The communication interface 310 is a circuit that controls communication on a network 3. The communication interface 310 is, for example, a network interface card (NIC). The SAN interface 311 is a circuit that controls communication with a storage device connected to the computer 1 through a storage area network. The SAN interface 311 is, for example, a host bus adapter (HBA).

The input device 307 is a device that transmits an input signal according to an operation. The input device 307 is, for example, a key device, such as a button mounted on a keyboard or the body of the computer 1, or a pointing device, such as a mouse or a touch panel. The output device 309 is a device that outputs information according to control of the computer 1. The output device 309 is, for example, an image output device (display device), such as a display, or an audio output device, such as a speaker. For example, an input/output device such as a touchscreen is used as the input device 307 and the output device 309. The input device 307 and the output device 309 may be integrated with the computer 1, or may be, for example, devices externally connected to the computer 1 without being included in the computer 1.

For example, the processor 301 reads out a program stored in the ROM 303 or the storage medium 305 into the RAM 302, and executes the processing of the compressing unit 200a or the processing of the decompressing unit 200b according to a procedure of the read-out program. At that time, the RAM 302 is used as a work area of the processor 301. The function of the storage unit 200c is carried out in the following way. The ROM 303 and the storage medium 305 store therein program files (such as those of an application program 24, a middleware 23, and an operating system (OS) 22 to be described later) and data files (such as the file F1 as a compression target and the compressed file F2), and the RAM 302 is used as the work area of the processor 301. The program read out by the processor 301 will be described using FIG. 36.

Figure 36:
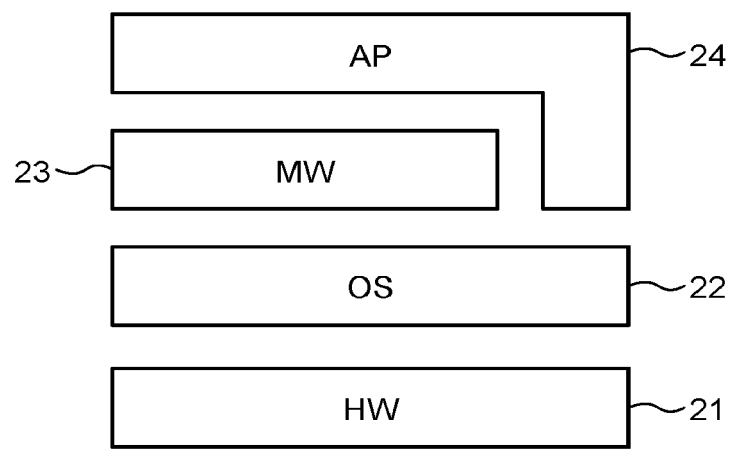
FIG. 36 is a diagram illustrating an example of the configuration of a program operated on the computer.

FIG. 36 illustrates an example of the configuration of the program operated on the computer 1. The OS 22 that controls a hardware group 21 (301 to 312) illustrated in FIG. 35 operates on the computer 1. The processor 301 operates following a procedure according to the OS 22 to control and manage the hardware group 21 so as to cause the hardware group 21 to perform processing according to the application program 24 or the middleware 23. The middleware 23 or the application program 24 is read out into the RAM 302 and is executed by the processor 301 on the computer 1.

When the compression function is called, the processor 301 performs processing based on at least a part of the middleware 23 or the application program 24 (performs the processing by controlling the hardware group 21 based on the OS 22) so as to carry out the function of the compressing unit 200a. When the decompression function is called, the processor 301 performs processing based on at least a part of the middleware 23 or the application program 24 (performs the processing by controlling the hardware group 21 based on the OS 22) so as to carry out the function of the decompressing unit 200b. Each of the compression function and the decompression function may be included in the application program 24, or may be a part of the middleware 23 that is executed by being called according to the application program 24.

The compression file F2 obtained by the compression function of the application program 24 (or the middleware 23) is partially decompressible based on a compression dictionary D1 in the compression file F2. When a midportion of the compression file F2 is decompressed, the compression data up to the portion as a decompression target is kept from being decompressed, so that load on the processor 301 is reduced. In addition, the compression data as a decompression target is partially loaded in the RAM 302, so that the work area is reduced.

Figure 37:
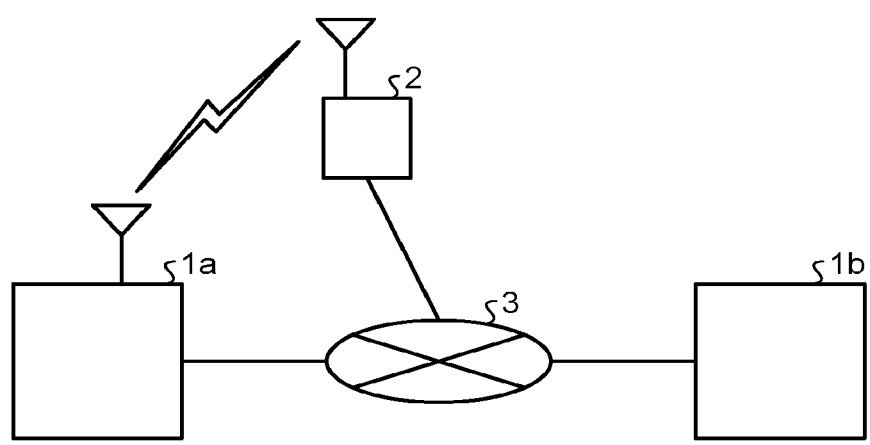
FIG. 37 is a diagram illustrating an example of the configuration of apparatuses in a system according to the embodiments.

FIG. 37 illustrates an example of the configuration of apparatuses in a system according to the embodiments. The system in FIG. 37 includes a computer 1a, a computer 1b, a base station 2, and the network 3. The computer 1a is connected in at least one of wireless and wired manners to the network 3 connected to the computer 1b.

Either of the computers 1a and 1b illustrated in FIG. 37 may include the compressing unit 200a and the decompressing unit 200b illustrated in FIG. 12. The computer 1a may include the compressing unit 200a and the computer 1b may include the decompressing unit 200b; or alternatively, the computer 1b may include the compressing unit 200a and the computer 1a may include the decompressing unit 200b. Both the computers 1a and 1b may include the compressing unit 200a and the decompressing unit 200b.

Hereinafter, some of modifications of the above-mentioned embodiment will be described. Not only the following modifications but also other changes in design in a range without departing from the scope of the invention can be made appropriately. A target of the compression processing is not limited be data in a file and may be a monitoring message that is output from a system. For example, processing is performed for compressing the monitoring message that is sequentially stored in a buffer by the above-mentioned compression processing and storing the monitoring message as a log file. Furthermore, compression may be performed based on a page in a database or based on a plurality of pages collectively, for example.

The data as a target of the compression processing described above is not limited to the character information as described above. The compression processing described above may be used for information including only numerical values, or for data such as an image or a sound. For example, a file containing a large amount of data obtained by audio synthesis includes many repetitions in the data, so that the compression dictionary is expected to improve the compression rate. Naturally, when only a part of the data is used, the partial decompression reduces excess decompression processing. A moving image captured by a fixed camera also includes many repetitions because images of respective frames are similar. Hence, applying the above-described compression processing can have the same effect as that in the case of the document data or the audio data.

Any one of the embodiments of the present invention provides an effect of preventing a compression rate from decreasing.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a compressing program that causes a computer to execute a process comprising:

searching a certain piece of data for the longest matching character strings;

generating frequency information including first frequency information and second frequency information of specific data based on an appearance frequency of each piece of first data and on an appearance frequency of each piece of position information about second data, the first data having a length smaller than a predetermined length among the found longest matching character strings, the second data having a length equal to or larger than the predetermined length among the found longest matching character strings; the first frequency information associating a compression code, first identification information, and the first data, the second frequency including information associating a compression code, second identification information, and a position information; and compressing target data by searching longest matching character string and generating compression codes; wherein, the compression codes are associated with a piece of first data of the longest matching character string among the pieces of first data contained in the frequency information, when the longest matching character string has a length smaller than the predetermined length; and the compression codes are associated with a piece of position information matching with position information about the longest matching character string among the pieces of position information about the second data contained in the frequency information and a compression code associated with length information about the longest matching character string among the pieces of first data contained in the frequency information, or when the longest matching character string has a length equal to or larger than the predetermined length.

2. The non-transitory computer-readable recording medium according to claim 1, wherein the process further comprises generating a Huffman tree that contains the first data, appearance frequencies of the first data, information obtained by contracting position information from a start of a sliding window to the second data, and appearance frequencies of the position information.

3. The non-transitory computer-readable recording medium according to claim 2, wherein the process further comprises storing the contracted information in each leaf of the Huffman tree, the contracted information being a consecutive number representing number of consecutive 1s or 0s from a leading bit, the consecutive number being obtained by expressing the position from the start of the sliding window until the second data appears in a fixed length of n bits.

4. The non-transitory computer-readable recording medium according to claim 2, wherein a part of a compression file output from the data as a compression target includes appearance frequency information corresponding to the Huffman tree.

5. A non-transitory computer-readable recording medium having stored therein a program that causes a computer to execute a decompression process comprising:

acquiring, from a part of a received compression file, frequency information that includes information associating a compression code, first identification information, and a first data with one another and information associating a compression code, second identification information, and a position information with one another, and that has been generated based on an appearance frequency of the first data having a length smaller than a predetermined length and on an appearance frequency of the position information about second data having a length equal to or larger than the predetermined length among the longest matching character strings;

reading out data from the compression file; and
generating decompression data based on the read-out data and the frequency information.

6. The non-transitory computer-readable recording medium according to claim 5, wherein
the frequency information is available to generate a Huffman tree in which each leaf contains the first data or the position information reflecting, in a structure thereof, the first data, the appearance frequency thereof, and the appearance frequency of the position information, a leaf of the Huffman tree containing the first data stores therein a first identifier, and a leaf of the Huffman tree containing the position information stores therein a second identifier, the process further comprises reading out a decompression data, following the Huffman tree, specifying a leaf of the Huffman tree corresponding to the decompression data, determining whether the specified leaf of the Huffman tree contains the first identifier or the second identifier, outputting a data contained in the leaf when the leaf contains the first identifier, and outputting a data based on the position information contained in the leaf when the leaf contains the second identifier.

7. A compression method for causing a computer to execute a process comprising:

searching a certain piece of data for the longest matching character strings;

generating frequency information including first frequency information and second frequency information of specific data based on an appearance frequency of each piece of first data and on an appearance frequency of each piece of position information about second data, the first data having a length smaller than a predetermined length among the found longest matching character strings, the second data having a length equal to or larger than the predetermined length among the found longest matching character strings; the first frequency information associating a compression code, first identification information, and the first data, the second frequency including information associating a compression code, second identification information, and a position information; and compressing target data by searching longest matching character string and generating compression codes; wherein, the compression codes are associated with a piece of first data of the longest matching character string among the pieces of first data contained in the frequency information, when the longest matching character string has a length smaller than the predetermined length; and the compression codes are associated with a piece of position information matching with position information about the longest matching character string among the pieces of position information about the second data contained in the frequency information and a compression code associated with length information about the longest matching character string among the pieces of first data contained in the frequency information, or when the longest matching character string has a length equal to or larger than the predetermined length.

8. The compression method according to claim 7, wherein the process further comprises generating a Huffman tree that contains the first data, appearance frequencies of the first data, information obtained by contracting position information from a start of a sliding window to the second data, and appearance frequencies of the position information.

9. The compression method according to claim 8, wherein the process further comprises storing the contracted information in each leaf of the Huffman tree, the contracted information being a consecutive number representing number of consecutive 1s or 0s from a leading bit, the consecutive number being obtained by expressing the position from the start of the sliding window until the second data appears in a fixed length of n bits.

10. The compression method according to claim 8, wherein a part of a compression file output from the data as a compression target includes appearance frequency information corresponding to the Huffman tree.

11. A decompression method for causing a computer to execute a process comprising:
   acquiring, from a part of a received compression file, frequency information that includes information associating a compression code, first identification information, and a first data with one another and information associating a compression code, second identification information, and a position information with one another, and that has been generated based on an appearance frequency of the first data having a length smaller than a predetermined length and on an appearance frequency of the position information about second data having a length equal to or larger than the predetermined length among the longest matching character strings;
   reading out data from the compression file; and
   generating decompression data based on the read-out data and the frequency information.

12. The decompression method according to claim 11, wherein
   the frequency information is available to generate a Huffman tree in which each leaf contains the first data or the position information reflecting, in a structure thereof, the first data, the appearance frequency thereof, and the appearance frequency of the position information,
   a leaf of the Huffman tree containing the first data stores therein a first identifier, and a leaf of the Huffman tree containing the position information stores therein a second identifier,
   the process further comprises reading out a decompression data, following the Huffman tree, specifying a leaf of the Huffman tree corresponding to the decompression data, determining whether the specified leaf of the Huffman tree contains the first identifier or the second identifier, outputting a data contained in the leaf when the leaf contains the first identifier, and outputting a data based on the position information contained in the leaf when the leaf contains the second identifier.

13. A compression device comprising:
   a processor that executes a process comprising:
   searching a certain piece of data for the longest matching character strings;
   generating frequency information including first frequency information and second frequency information of specific data based on an appearance frequency of each piece of first data and on an appearance frequency of each piece of position information about second data, the first data having a length smaller than a predetermined length among the found longest matching character strings, the second data having a length equal to or larger than the predetermined length among the found longest matching character strings; the first frequency information associating a compression code, first identification information, and the first data, the second frequency including information associating a compression code, second identification information, and a position information; and
   compressing target data by searching longest matching character string and generating compression codes; wherein,
   the compression codes are associated with a piece of first data of the longest matching character string among the pieces of first data contained in the frequency information, when the longest matching character string has a length smaller than the predetermined length; and
   the compression codes are associated with a piece of position information matching with position information about the longest matching character string among the pieces of position information about the second data contained in the frequency information and a compression code associated with length information about the longest matching character string among the pieces of first data contained in the frequency information, or when the longest matching character string has a length equal to or larger than the predetermined length.

14. The compression device according to claim 13, wherein the process further comprises generating a Huffman tree that contains the first data, appearance frequencies of the first data, information obtained by contracting position information from a start of a sliding window to the second data, and appearance frequencies of the position information.

15. The compression device according to claim 14, wherein the process further comprises storing the contracted information in each leaf of the Huffman tree, the contracted information being a consecutive number representing number of consecutive 1s or 0s from a leading bit, the consecutive number being obtained by expressing the position from the start of the sliding window until the second data appears in a fixed length of n bits.

16. The compression device according to claim 14, wherein a part of a compression file output from the data as a compression target includes appearance frequency information corresponding to the Huffman tree.

17. A decompression device comprising:
   a processor that executes a process comprising:
   acquiring, from a part of a received compression file, frequency information that includes information associating a compression code, first identification information, and a first data with one another and information associating a compression code, second identification information, and a position information with one another, and that has been generated based on an appearance frequency of the first data having a length smaller than a predetermined length and on an appearance frequency of the position information about second data having a length equal to or larger than the predetermined length among the longest matching character strings;
   reading out data from the compression file; and
   generating decompression data based on the read-out data and the frequency information.

18. The decompression device according to claim 17, wherein
   the frequency information is available to generate a Huffman tree in which each leaf contains the first data or the position information reflecting, in a structure thereof, the first data, the appearance frequency thereof, and the appearance frequency of the position information,
   a leaf of the Huffman tree containing the first data stores therein a first identifier, and a leaf of the Huffman tree containing the position information stores therein a second identifier,
   the process further comprises reading out a decompression data, following the Huffman tree, specifying a leaf of the Huffman tree corresponding to the decompression data, determining whether the specified leaf of the Huffman tree contains the first identifier or the second identifier, outputting a data contained in the leaf when the leaf contains the first identifier, and outputting a data based on the position information contained in the leaf when the leaf contains the second identifier.

* * * * *